US012331168B2

(12) United States Patent
Sakumoto

(10) Patent No.: US 12,331,168 B2
(45) Date of Patent: Jun. 17, 2025

(54) THERMAL DECOMPOSITION APPARATUS

(71) Applicant: Niimi-Solar Co., Ltd., Niimi (JP)

(72) Inventor: Hideyuki Sakumoto, Niimi (JP)

(73) Assignee: Niimi-Solar Co., Ltd., Niimi (JP)

( * ) Notice: Subject to any disclaimer, the term of this patent is extended or adjusted under 35 U.S.C. 154(b) by 569 days.

(21) Appl. No.: 17/606,450

(22) PCT Filed: Apr. 22, 2020

(86) PCT No.: PCT/JP2020/017340

§ 371 (c)(1),
(2) Date: Oct. 26, 2021

(87) PCT Pub. No.: WO2020/218341

PCT Pub. Date: Oct. 29, 2020

(65) Prior Publication Data

US 2022/0195139 A1 Jun. 23, 2022

(30) Foreign Application Priority Data

Apr. 26, 2019 (JP) ................................. 2019-086335
Jun. 12, 2019 (JP) ................................. 2019-109419

(51) Int. Cl.
*B23P 19/00* (2006.01)
*B09B 3/45* (2022.01)
(Continued)

(52) U.S. Cl.
CPC ................. *C08J 11/14* (2013.01); *B09B 3/45* (2022.01); *H10F 71/00* (2025.01);
(Continued)

(58) Field of Classification Search
CPC .. B29B 17/04; B29B 2017/0496; C08J 11/14; C08J 2367/02; H01L 31/18; B09B 3/45;
(Continued)

(56) References Cited

U.S. PATENT DOCUMENTS 11,359,535 B2 * 6/2022 Mizuno ................. F01N 3/2006
2013/0306136 A1 * 11/2013 Hendrickson, Jr. ..... H02S 40/10 136/246
2018/0318842 A1 * 11/2018 Korzenski ................. B09B 3/40

FOREIGN PATENT DOCUMENTS

CN 104481604 A 4/2015
JP H11165150 A 6/1999
(Continued)

OTHER PUBLICATIONS

International Search Report in PCT/JP2020/017340, dated Aug. 11, 2020.

*Primary Examiner* — Paul D Kim
(74) *Attorney, Agent, or Firm* — Global IP Counselors, LLP

(57) ABSTRACT

A thermal decomposition apparatus comprises: a thermal decomposition apparatus mechanism being provided with a thermal decomposition furnace that decomposes a panel having a plastic layer; and a superheated steam generator that generates superheated steam being supplied to the thermal decomposition furnace. A furnace body of the thermal decomposition furnace is provided with an inner wall made of metal having a space for housing the panel, and with an outer wall made of metal enclosing the inner wall. A thermal insulation material layer is provided between the inner wall and the outer wall that encloses the inner wall. A heat storage material layer is provided between the inner wall and the thermal insulation material layer.

6 Claims, 29 Drawing Sheets

(51) Int. Cl.
*C08J 11/14* (2006.01)
*H05K 13/04* (2006.01)
*H10F 71/00* (2025.01)
*B09B 101/15* (2022.01)
*B09B 101/75* (2022.01)

(52) U.S. Cl.
CPC ....... *B09B 2101/15* (2022.01); *B09B 2101/75* (2022.01); *C08J 2367/02* (2013.01)

(58) Field of Classification Search
CPC ......... B09B 2101/15; B09B 5/00; B09B 3/00; B09B 2101/75; Y02W 30/62
See application file for complete search history.

(56) References Cited

FOREIGN PATENT DOCUMENTS

| | | | |
|---|---|---|---|
| JP | 2001-064654 | A | 3/2001 |
| JP | 2001-208327 | A | 8/2001 |
| JP | 2004-283634 | A | 10/2004 |
| JP | 2005-095855 | A | 4/2005 |
| JP | 2005231984 | A | 9/2005 |
| JP | 2010-087464 | A | 4/2010 |
| JP | 2013-209527 | A | 10/2013 |
| JP | 2014024037 | A | 2/2014 |

* cited by examiner

THERMAL DECOMPOSITION APPARATUS

CROSS-REFERENCE TO RELATED APPLICATIONS

This application is a U.S. National stage of International Application No. PCT/JP2020/017340 filed on Apr. 22, 2020. This application claims priority to Japanese Patent Application Nos. 2019-086335 filed on Apr. 26, 2019 and 2019-109419 filed on Jun. 12, 2019. The entire disclosure of Japanese Patent Application Nos. 2019-086335 and 2019-109419 are hereby incorporated herein by reference.

BACKGROUND

Field of the Invention

The present invention relates to a thermal decomposition apparatus that is used to decompose a panel having a plastic material layer.

Background Information

As an example of the panel having a plastic material layer, there is a solar cell panel. The solar cell panel is provided with solar cells being held by a plastic material layer on one surface of a cover glass; and wiring members being connected to the solar cells. Since such a solar cell panel contains various kinds of metals and glass which can be reused, it is preferable that a used solar cell panel is decomposed and reused.

As a method of decomposing the solar cell panel, it is known that the cover glass is separated from the solar cells and the wiring members by conducting heat treatment of the solar cell panel in a furnace in an atmospheric environment so as to burn the plastic materials to be eliminated. (For example, refer to Japanese Patent Application Laid Open as H11-165150 (Patent Publication 1))

SUMMARY

However, the method being disclosed in Patent Publication 1 has a concern of a fire or the like to occur in the furnace because heat treatment of the solar cell panel is conducted at a high temperature in the furnace in the atmospheric environment.

The present invention is made in order to improve the aforementioned present situation.

The thermal decomposition apparatus of the present invention is provided with a thermal decomposition apparatus mechanism having a thermal decomposition furnace which decomposes the panel having a plastic material layer; and a superheated steam generator which generates the superheated steam being supplied to the thermal decomposition furnace; and wherein, a furnace body of the thermal decomposition furnace is provided with an inner wall made of metal that has a space for accommodating the panel; and an outer wall made of metal that encloses the inner wall; wherein, a thermal insulation material layer that encloses the inner wall is provided between the inner wall and the outer wall; and a heat storage material layer is provided between the inner wall and the thermal insulation material layer.

By using the thermal decomposition apparatus of the present invention, a panel can be heated with the superheated steam, so that the panel having a plastic material layer can be heated in a superheated steam environment containing little oxygen; a fire or the like can be prevented in the thermal decomposition furnace; and treatment can be conducted safely. In addition, the furnace body of the thermal decomposition furnace has a double structure with the inner wall and the outer wall; wherein, the inner wall is enclosed by a thermal insulation material layer being provided between the inner wall and the outer wall; and a heat storage material layer is provided between the inner wall and the thermal insulation material layer, so that heat can be stored in the heat storage material layer when the temperature of the inside of the inner wall is raised by introducing the superheated steam into the inner wall. Therefore, when the thermal decomposition treatment of a panel is repeated, it is possible to shorten the time until the inside temperature of the inner wall reaches the desired temperature after replacing the panel; thereby, enhancing the treatment efficiency. Moreover, since the space, in which the panel being a decomposition target is placed, is enclosed by the inner wall made of metal, it is possible to prevent or suppress the gas or the superheated steam in the inner wall from coming into contact with the heat storage material layer or the thermal insulation material layer; thereby, reducing the deterioration of the heat storage material layer and the thermal insulation material layer.

In the thermal decomposition apparatus of the present invention, when the aforementioned panel is, for example, a solar cell panel, by heating the solar cell panel with the high-temperature superheated steam, the plastic material layer such as a filling material and an adhesive both of which cover the solar cells, and a back film will be sublimated and vaporized; so that the solar cell panel can be decomposed into metals such as a cover glass, solar cells, copper wires or the like. By doing the aforementioned process, it is possible to decompose a used solar cell panel into solar cells containing recyclable raw materials such as silicon or the like, recyclable metals and glass without discharging a gas that has a high environmental load.

In the thermal decomposition apparatus of the present invention, a thermal insulation sheet layer comprising a sheet-like thermal insulation material having flexibility may be provided between the inner wall and the outer wall, enclosing the inner wall.

According to the aforementioned structure, since the thermal expansion of an inner wall made of metal can be absorbed by the thermal insulation sheet layer, it is possible to prevent a damage of the heat storage material layer and the thermal insulation material layer due to thermal expansion of the inner wall.

In the thermal decomposition apparatus of the present invention, the thermal decomposition furnace is provided with a superheated steam introducing portion that introduces the superheated steam into the inner wall; wherein, the superheated steam introducing portion is provided with a main pipe portion, which is installed, penetrating through the outer wall and the inner wall of the furnace body; and a branch pipe portion which branches from the main pipe portion inside the inner wall; wherein, the main pipe portion may also be provided with a main pipe that is installed, penetrating through the outer wall and the inner wall; and a main pipe flange that is screwed into an outside-the-furnace end of the main pipe.

According to the aforementioned structure, after assembling the main pipe portion and the branch pipe portion of the superheated steam introducing portion excluding the main pipe flange, the assembled branch pipe portion can be placed inside the inner wall, by inserting the main pipe from the inside of the inner wall through a main pipe insertion hole that is made in the wall of the surface body so as to be exposed to the outside of the furnace body. In other words, by constructing in such a manner that a main pipe flange is screwed into outside-the-furnace end of the main pipe of the superheated steam introducing portion, it becomes easy to install the superheated steam introducing portion to the furnace body; and at the same time the maintainability can be enhanced since it is easy to remove the superheated steam introducing portion from the furnace body. Moreover, since a worker can perform installation and removal work of the superheated steam introducing portion to and from the furnace body without entering the inside of the furnace body, a burden on the worker is reduced. In addition, the diameter of a main pipe insertion hole, being provided in a wall of the furnace body for a main pipe of the superheated steam introduction portion to be inserted, can remain in a size as large as the main pipe can be inserted, so that it is possible to suppress the heat inside the furnace body from being released through the main pipe insertion hole.

In the thermal decomposition apparatus of the present invention, the thermal decomposition furnace is provided with a superheated steam introducing portion for introducing the superheated steam into the inner wall; and a gas discharge portion for discharging the gas in the inner wall to the outside of the furnace body; wherein, inside the inner wall, the superheated steam introducing portion may be provided with a spray portion facing a discharge port that sprays the superheated steam toward the discharge port of the gas discharge portion According to the aforementioned structure, by spraying the superheated steam toward the gas discharge port inside the furnace body, gas being discharged from the furnace body can be heated in the furnace body immediately before being sucked into the gas discharge port; thereby, making it possible to thermally decompose the components that are contained in the gas being discharged from the furnace body.

The thermal decomposition apparatus of the present invention can remove a plastic material layer of a panel without discharging the gas having a high environmental load. Moreover, when the panel is a solar cell panel, the solar cell panel can be decomposed into solar cells containing recyclable raw materials such as silicon or the like; recyclable metals; and glass.

BRIEF DESCRIPTION OF THE DRAWINGS

FIGS. 12A and 12B are schematic diagrams showing another example of a gas cooling device; wherein, FIG. 12A is a plane view; and FIG. 12B is a side view;

DETAILED DESCRIPTION OF EMBODIMENTS

Figure 1:
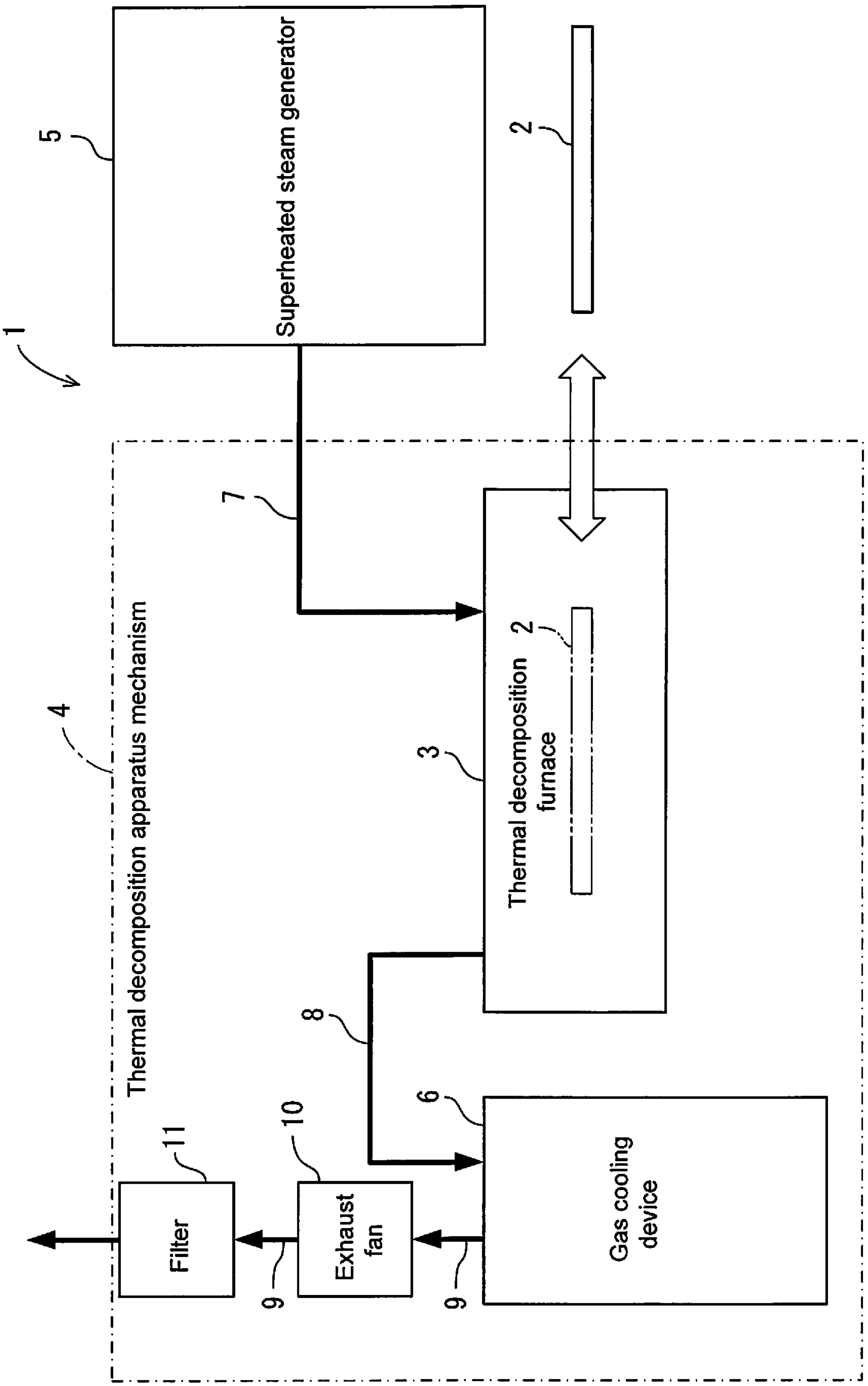
FIG. 1 is a schematic configuration diagram showing a thermal decomposition apparatus of an embodiment.

An embodiment of the present invention will be described with reference to the drawings. FIG. 1 is a schematic configuration diagram showing an embodiment of a thermal decomposition apparatus. A thermal decomposition apparatus 1 is provided with a thermal decomposition apparatus mechanism 4 including a thermal decomposition furnace 3 that decomposes a panel 2 having a plastic material layer; and a superheated steam generator 5 that generates the superheated steam to be supplied to the thermal decomposition furnace 3. The thermal decomposition apparatus mechanism 4 is provided with a gas cooling device 6 that cools and solidifies exhaust gas from the thermal decomposition furnace 3 that contains the components of a plastic material layer being vaporized in the thermal decomposition furnace 3.

Superheated steam being generated by the superheated steam generator 5 is supplied to the thermal decomposition furnace 3 by way of a superheated steam pipe 7. Exhaust gas from the thermal decomposition furnace 3 is introduced into the gas cooling device 6 by way of an exhaust gas pipe 8. The gas being discharged from the gas cooling device 6 is discharged to the outside of the thermal decomposition apparatus mechanism by way of an exhaust fan 10 and a filter 11 that are provided to the discharge pipe 9.

A panel 2 is, for example, a solar cell panel that is provided with a cover glass; solar cells being held on one surface of the cover glass by a plastic material layer; metal wiring members being electrically connected to the solar cells; and a back film covering the surface being opposite to the cover glass in the plastic material layer. Furthermore, in the panel 2, a metal frame being installed to the periphery of the solar cell panel is removed.

Figure 2:
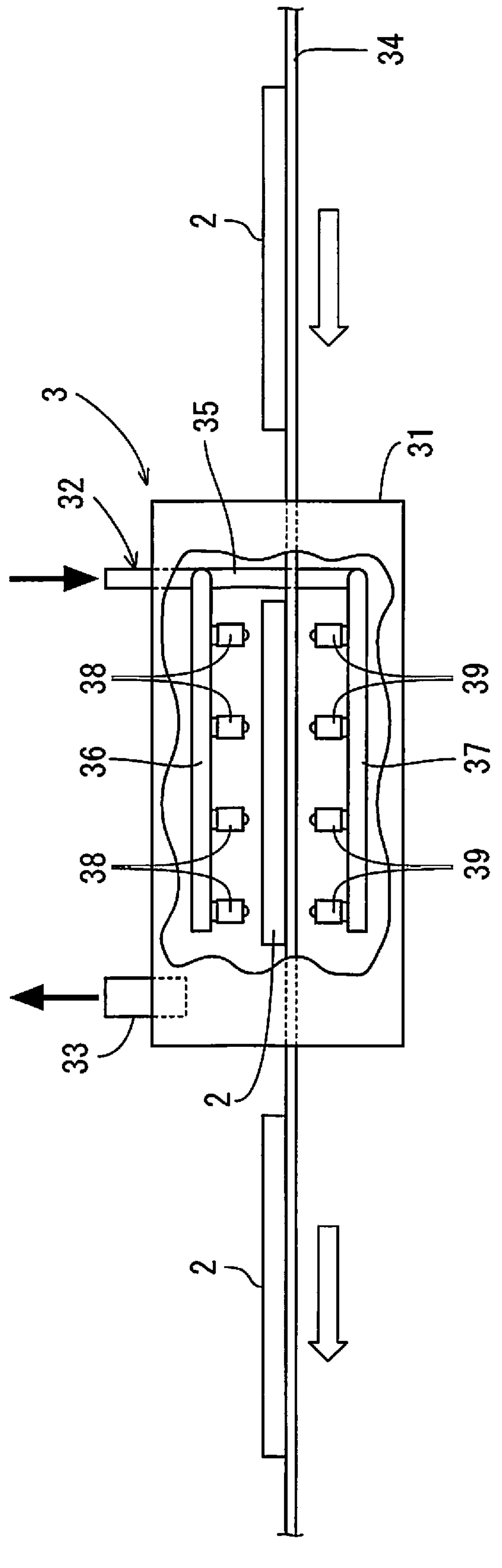
FIG. 2 is a schematic side view showing an example of a thermal decomposition furnace.

As shown in FIG. 2, the thermal decomposition furnace 3 is provided with a furnace body 31 having an internal space; a superheated steam introducing pipe 32 that is connected to an end of the superheated steam pipe 7 and is guided from the outside of the furnace body 31 to the inside; a gas discharge pipe 33 that is connected to an internal space of the furnace body 31 as well as to the exhaust gas pipe 8; and a conveyance portion 34 that conveys the panel 2 so as to pass through the furnace body 31.

The superheated steam introducing pipe 32 is provided with a main steam pipe portion (main pipe portion) 35 that extends vertically, penetrating through the top part of the furnace body 31; an upper steam pipe portion (branch pipe portion) 36 that branches from an upper part of the main steam pipe portion 35 in the furnace body 31; and a lower portion steam pipe portion 37 (branch pipe portion) that is connected to the lower end of the main steam pipe portion 35. The main steam pipe portion 35 is provided to the upstream side of the furnace body 31 against the conveying direction of the conveyance portion 34. The upper steam pipe portion 36 is provided in the upper part of the conveyance portion 34 in a multiple-time repeated zigzag pattern in an approximately horizontal plane. The lower steam pipe portion 37 is provided in the lower portion of the conveyance portion 34 in a multiple-time repeated zigzag pattern in an approximately horizontal plane.

The upper steam pipe portion 36 is provided with a plurality of upper nozzles 38 that sprays the superheated steam downward. The lower steam pipe portion 37 is provided with a plurality of lower nozzles 39 that sprays the superheated steam upward. In other words, the upper nozzles 38 and the lower nozzles 39 are placed so as to sandwich the panel 2 in the thermal decomposition furnace 3. The upper nozzles 38 and the lower nozzles 39 are placed longitudinally and horizontally, respectively, along the horizontal surface being parallel to the panel 2 in the thermal decomposition furnace 3, in such a manner that are placed in a lattice pattern or in a zigzag pattern in a plane view.

In the thermal decomposition furnace 3, the gas discharge pipe 33 is placed in the downstream-side part of the top section of the furnace body 31 in the conveying direction of the conveyance portion 34. The gas discharge pipe 33 has one end of the exhaust gas pipe 8 connected thereto. The conveyance portion 34 is configured in such a manner that the panel 2 can mounted thereon; and that the panel 2 is conveyed so as to pass through the inside of the furnace body 31.

Figure 3:
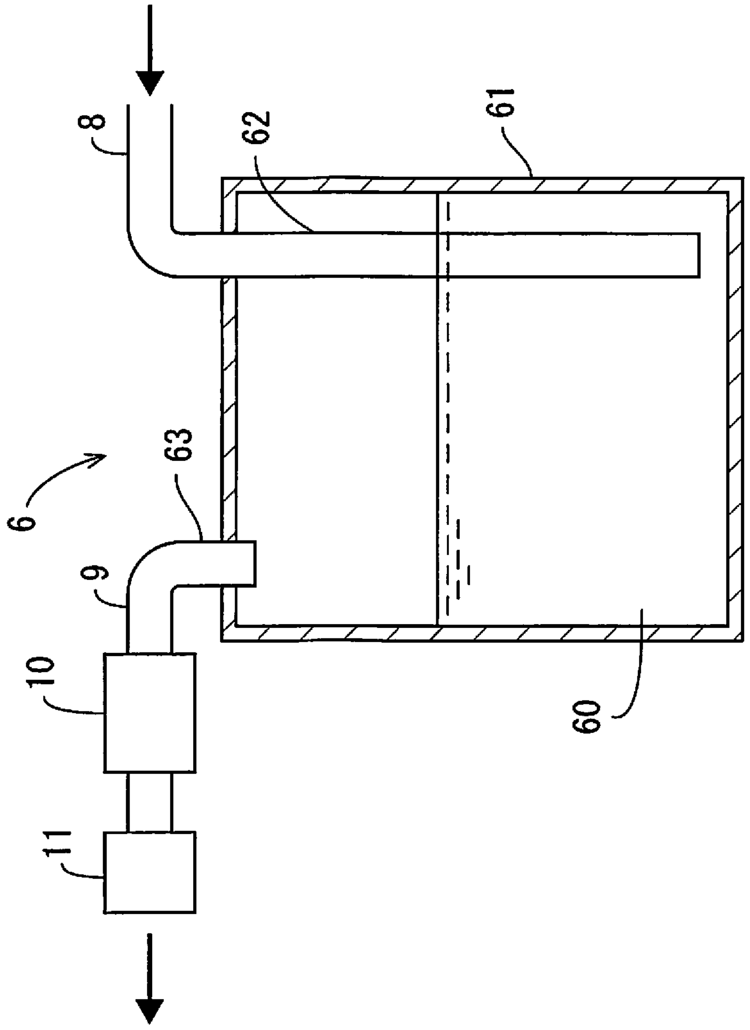
FIG. 3 is a schematic side view showing an example of a gas cooling device.

As shown in FIG. 3, the gas cooling device 6 is provided with a closed tank 61 that contains water 60; an exhaust gas introducing pipe 62 that is connected to the other end of the exhaust gas pipe 8 as well as guided from the outside of the closed tank 61 to the inside; and a gas discharge pipe 63 that is connected to an inner space of the closed tank 61 as well as connected to the discharge pipe 9.

The exhaust gas introducing pipe 62 is provided so as to extend vertically, penetrating through the top of the closed tank 61. The upper end of the exhaust gas introducing pipe 62 is provided so as to project upward from the top surface of the closed tank 61, and is connected to the exhaust gas pipe 8. The lower end of the exhaust gas introducing pipe 62 is located in the lower part of the closed tank 61, and is immersed in water 60 that the closed tank 61 contains.

The gas discharge pipe 63 is provided at a different position from the exhaust gas introducing pipe 62, so as to extend vertically, penetrating through the top of the closed tank 61. The lower end of the gas discharge pipe 63 is located in the upper part of the closed tank 61, so as not to be immersed in water 60. The upper end of the gas discharge pipe 63 is placed so as to project upward from the top surface of the closed tank 61, and to be connected to the discharge pipe 9.

As shown in FIG. 3, the discharge pipe 9 is provided with an exhaust fan 10 and a filter 11 in order of the gas flow direction starting from the downstream side. The exhaust fan 10 operates in such a manner as to move the gas in the discharge pipe 9 from the gas cooling device 6 to the filter 11.

Next, a decomposition method of the panel 2 by using the thermal decomposition apparatus 1 will be described. As shown in FIG. 3, the panel 2 is placed on the conveyance portion 34 at a position that is upstream side of the thermal decomposition furnace 3 in the conveying direction; and is transferred to the inside of the furnace body 31 of the thermal decomposition furnace 3 by driving the conveyance portion 34.

Superheated steam is supplied into the furnace body 31 from the superheated steam generator 5 by way of the superheated steam pipe 7. The superheated steam being supplied to the thermal decomposition furnace 3 is introduced into the superheated steam introducing pipe 32 of the thermal decomposition furnace 3 and sprayed into the furnace body 31 from the upper nozzles 38 and the lower nozzles 39. The inside of the furnace body 31 is in a superheated steam atmosphere being filled with superheated steam and in a state containing little oxygen. The temperature of the inside of the furnace body 31 is, for example, from 400 to 1200 degrees; and preferably, 600 degrees or higher.

The panel 2 that has a plastic material layer being transferred to the inside of the furnace body 31 is heated to 600° C. or higher in a superheated steam atmosphere; and a plastic resin composing the plastic material layer is sublimated and vaporized. When the panel 2 is a solar cell panel, the plastic material layer such as a filler and an adhesive, and the back film or the like of the panel 2 is sublimated and removed; and the panel 2 is separated into a cover glass, solar cells, and metal wiring members.

At this point, since a plurality of the upper nozzles 38 and the lower nozzles 39 that spray the superheated steam are placed so as to sandwich the panel 2, the panel 2 can be heated effectively from both sides; thereby promoting the decomposition of the panel 2 so as to shorten the treatment time.

Since driving the exhaust fan 10 makes the inside of the gas cooling device 6 be at a negative pressure, a gas flow is generated in the exhaust pipe 8, that streams from the thermal decomposition furnace 3 toward the gas cooling device 6. The gas in the furnace body 31 is discharged from the gas discharge pipe 33 to the outside of the thermal decomposition furnace 3. The exhaust gas containing plastic resin components being discharged from the thermal decomposition furnace 3 is sent to the gas cooling device 6 by way of the exhaust gas pipe 8; and is introduced into the closed tank 61 by way of the exhaust gas introducing pipe 62.

The exhaust gas containing the vaporized plastic resin components is discharged from the lower end of the exhaust gas introducing pipe 62 into the closed tank 61 and passes through the water 60. At this time, the exhaust gas is cooled; and the vaporized plastic resin components are solidified, and precipitate inside the closed tank 61. As a result, it is possible to prevent most of the gases having a high environmental load, such as carbon oxide and hydrocarbon-based gas, from being released to the outside of the gas cooling device 6.

The gas being sprayed from the exhaust gas introducing pipe 62 and passing through the water 60 is discharged from the closed tank 61 to the discharge pipe 9 outside of the gas cooling device 6 by way of the gas discharge pipe 63. The exhaust gas being discharged is released to the ambient atmosphere (atmosphere) by way of the exhaust fan 10 and the filter 11 that are provided to the discharge pipe 9. Furthermore, the lower end (tip) of the exhaust gas introducing pipe 62 may be provided with a mesh member or a porous member; thereby, making bubbles being sprayed from the exhaust gas introducing pipe 62 dispersed and small, so as to enlarge the contact area between the water and the exhaust gas.

In the present embodiment, since harmful gas in the exhaust gas from the thermal decomposition furnace 3 is removed through the filter 11 of the discharge pipe 9 after being solidified by the gas cooling device 6, it is surely possible to prevent the release of the harmful gas to the outside.

The panel 2, from which the plastic material layer is removed in the thermal decomposition furnace 3, is conveyed to the outside of the thermal decomposition furnace 3 on the downstream side in the conveying direction by driving the conveyance portion 34; and then retrieved. When the panel 2 is a solar cell panel, the retrieved panel 2 is separated into a cover glass, solar cells and metal wiring members; and recycled.

As described above, in the present embodiment, by heating the panel 2 having a plastic material layer with the high-temperature superheated steam in the thermal decomposition furnace 3, it is possible to have the plastic material layer sublimated and vaporized; thereby making it possible to remove the plastic material layer from the panel 2. Furthermore, by making the gas, containing the plastic material components that are sublimated in the thermal decomposition furnace 3, pass through the water in the gas cooling device 6 so as to be solidified, and by making the solid plastic materials precipitate in the gas cooling device 6, it is possible to prevent most of the gases having a high environmental load, such as carbon dioxide and hydrocarbon-based gas, from being released to the outside of the gas cooling device 6.

Moreover, since the target of treatment to be conducted by the thermal decomposition apparatus 1 is a panel 2 (an article in a shape of a plate), it is possible to reduce the size of an internal space of the thermal decomposition furnace 3 in panel thickness, thereby reducing the energy that is necessary for making the internal space be at a high temperature (for example, 600 degrees or higher). Furthermore, by placing a plurality of nozzles 38 and 39 spraying superheated steam so as to face the main surfaces (the upper surface and the lower surface) of the panel 2, it is possible to reduce a temperature variation of the panel 2 while heating; thereby shortening the time of the decomposition treatment of the panel. In addition, since the thermal decomposition apparatus 1 uses the superheated steam, the panel 2 having the plastic material layer can be heated in an atmosphere containing little oxygen; thereby preventing a fire or the like from occurring inside the thermal decomposition furnace 3; and conducting the treatment safely.

In the thermal decomposition furnace 3, in order to enhance the sealing ability of the furnace body 31 in view of, for example, an increase of energy efficiency of the thermal decomposition furnace 3 and a restraint of air inflow into the furnace body 31 or the like, doors that can be opened and closed may be provided to a panel entrance port (upstream side of conveyance) and a panel ejection port (downstream side of conveyance) in the furnace body 31.

Figure 4A:
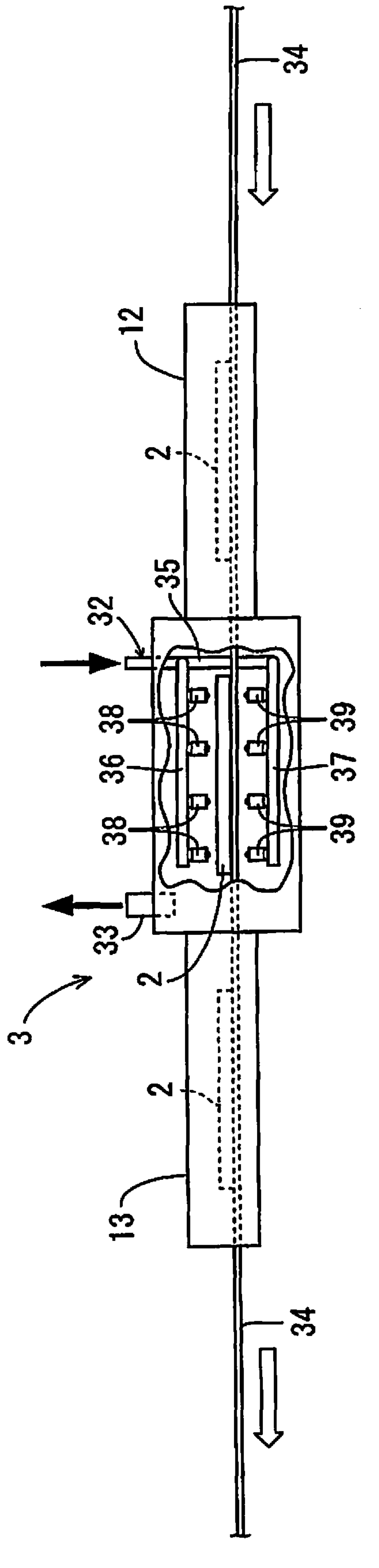
FIGS. 4A and 4B are schematic side views showing another example of a thermal decomposition furnace.

Furthermore, as shown in FIG. 4A, a pre-treatment chamber 12 and a post-treatment chamber 13 may be connected to the panel entrance port and the panel ejection port of the furnace body 31. In this case, by being connected to a gas supply pipe that supplies the pre-treatment chamber 12 and the post-treatment chambers 13 with, for example, nitrogen gas (inert gas) or low temperature steam of 200° C. or lower, and by filling the pre-treatment chamber 12 and the post-treatment chamber 13 with the nitrogen gas or low temperature steam, it is possible to restrain the inflow of oxygen (air) into the furnace body 31.

Figure 4B:
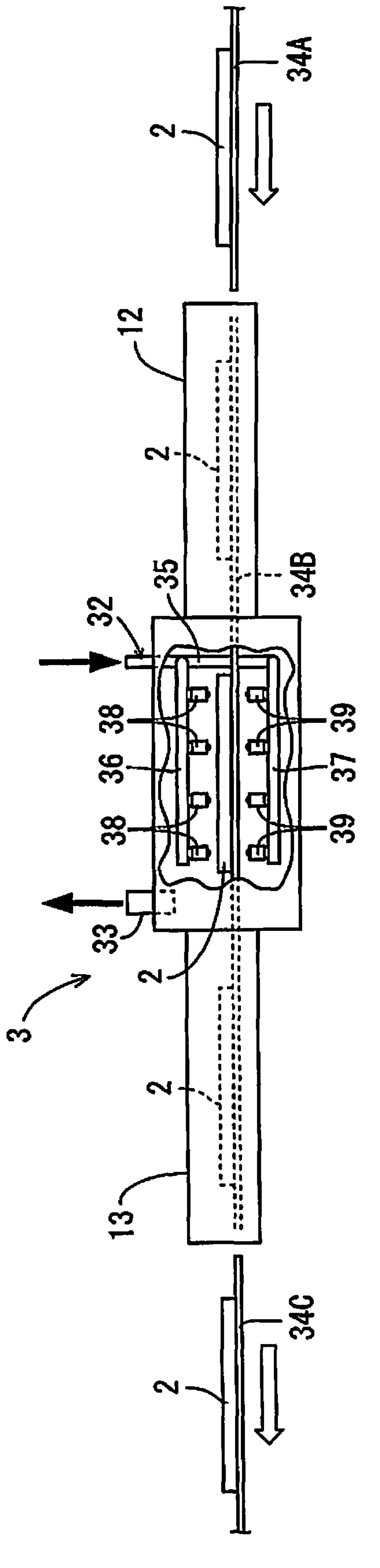

As shown in FIG. 4B, after the pre-treatment chamber 12 and the post-treatment chamber 13 are connected to the furnace body 31, the conveyance portion 34 is divided into an entrance-side conveyance portion 34A, an in-furnace conveyance portion 34B, and an ejection-side conveyance portion 34C; wherein, a door that can be opened and closed may be provided to each of the upstream end in the conveying direction of the pre-treatment chamber 12 and the downstream end in the conveying direction of the post-treatment chamber 13. In this case, by stopping the supply of the nitrogen gas or the low-temperature steam to the chambers 12 and 13 after filling the chambers 12 and 13 with the nitrogen gas or the low-temperature steam and closing the doors, it is possible to reduce the supply amount of the nitrogen gas or the low-temperature steam, while restraining the inflow of oxygen into the furnace body 31; thereby reducing the treatment cost.

Furthermore, the in-furnace conveyance portion 34B may be divided into a pre-treatment chamber 12, a furnace body 31, and a post-treatment chamber 13; and doors may be provided to each of the panel entrance port and the panel ejection port of the furnace body 31. In this case, by introducing the panel 2 into the pre-treatment chamber 12 with the door of the panel entrance port of the furnace body 31 closed; and by opening the door of the furnace body 31 and introducing the panel 2 into the furnace body 31, after closing the door of the panel entrance port of the pre-treatment chamber 12 and filling the pre-treatment chamber 12 with the nitrogen gas or low-temperature steam, it is possible to prevent the inflow of oxygen into the furnace body 31. Also, by opening the door of the panel ejection port of the furnace body 31, with the door of the panel ejection port of the post-treatment chamber 13 being filled with nitrogen gas or low-temperature steam closed, so as to eject the panel 2 in the furnace body 31 to the post-treatment chamber 13; and then by opening the door of the post-treatment chamber 13 so as to eject the panel 2 after closing the door of the furnace body 31, it is possible to prevent the inflow of oxygen into the furnace body 31.

An exhaust pipe being connected to a vacuum suction device may be connected to each of the pre-treatment chamber 12 and the post-treatment chamber 13. In this case, by filling the chambers 12 and 13 with nitrogen gas or steam after vacuuming the interior of the chambers 12 and 13 so as to place the chambers 12 and 13 in a low oxygen state, it is possible to suppress the inflow of oxygen into the furnace body 31 more reliably.

Figure 5:
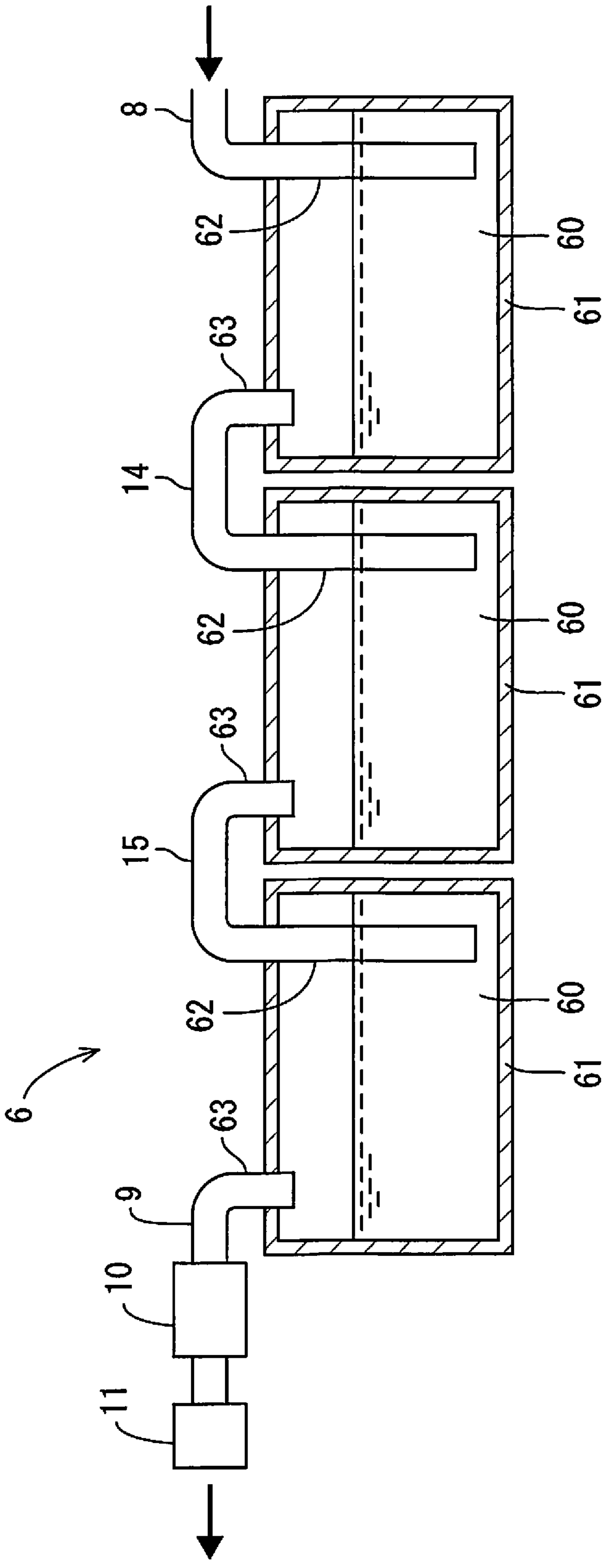
FIG. 5 is a schematic side view showing another example of a gas cooling device.

In addition, as shown in FIG. 5, the gas cooling device 6 may be provided with a plurality of closed tanks 61 continuously. In this embodiment, three closed tanks 61 are provided; wherein, an exhaust gas pipe 8 is connected to an exhaust gas introducing pipe 62 that is provided in the closed tank 61 of the first process (the most upstream side of the gas flow direction). A gas discharge pipe 63 being provided in the closed tank 61 of the first process is connected to the exhaust gas introducing pipe 62 being provided in the closed tank 61 of the second process (the second in the gas flow direction) by way of a connecting pipe 14. The gas discharge pipe 63 being provided in the closed tank 61 of the second process is connected to the exhaust gas introducing pipe 62 being provided in the closed tank 61 of the third process (the most downstream side of the gas flow direction) by way of a connecting pipe 15. A discharge pipe 9 is connected to the gas discharge pipe 63 of the closed tank 61 of the third process.

In the present embodiment, by cooling the exhaust gas being discharged from the thermal decomposition furnace 3 with the water 60 in the three closed tanks 61 more reliably, plastic material components being contained in the exhaust gas can precipitate in each closed tank 61 of the gas cooling device 6. In this way, it is possible to more reliably prevent the gases having a high environmental load such as carbon dioxide or hydrocarbon gas from being released to the outside of the gas cooling device 6.

By connecting a plurality of closed tanks 61 in parallel between the exhaust gas pipe 8 and the discharge pipe 9; and reducing the amount of exhaust gas being introduced into each closed tank 61, so as to suppress the temperature increase of the water 60 in each enclosed tank 61, the plastic material components being contained in the exhaust gas may reliably precipitate in each closed tank 61 of the gas cooling device 6.

Moreover, in the above-described embodiment, the thermal decomposition apparatus 1 is provided with a continuous-type of thermal decomposition furnace 3 having the conveyance portion 34 that conveys the panel 2 so as to go through the inside of the furnace body 31; but may be provided with a batch-type thermal decomposition furnace.

Figure 6:
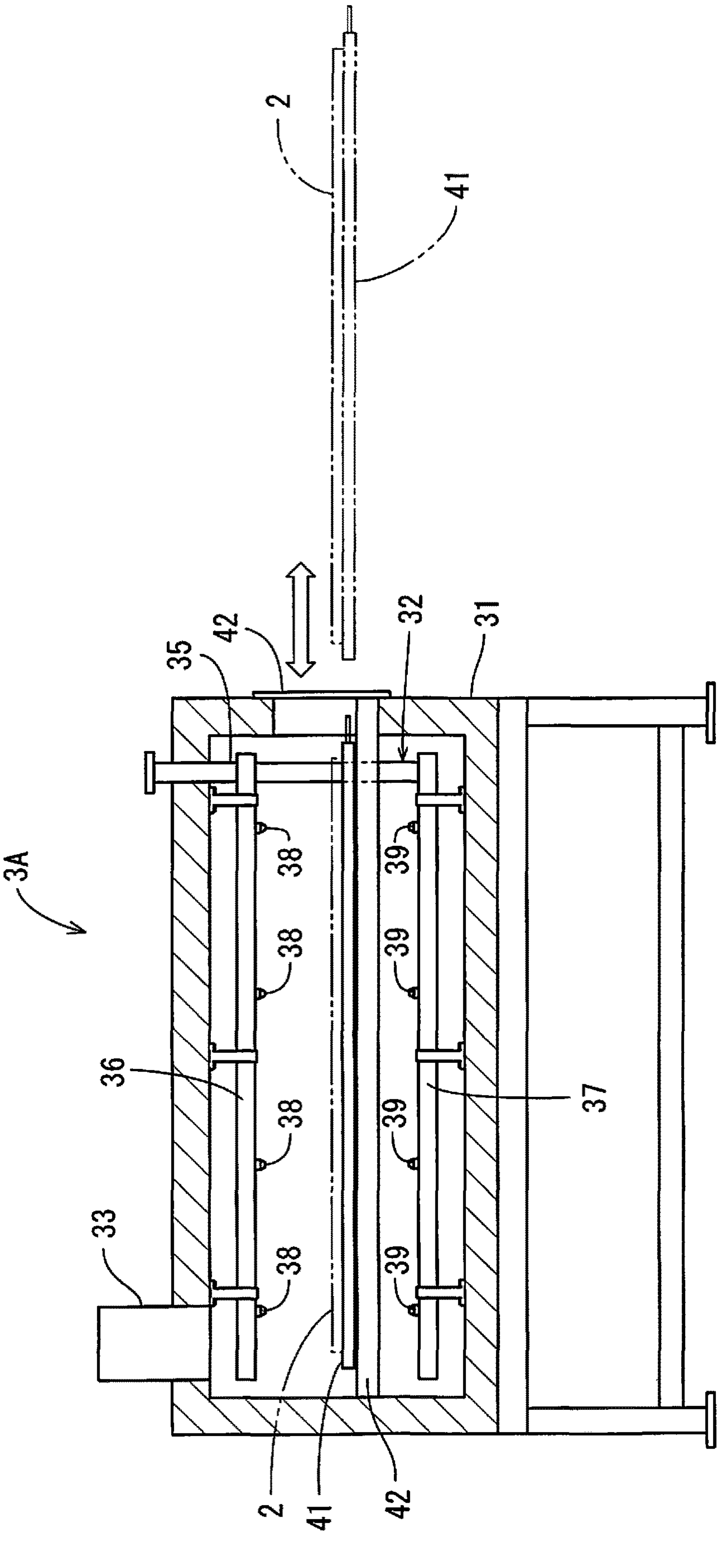
FIG. 6 is a schematic side view showing another example of a thermal decomposition furnace.

For example, as shown in FIG. 6, the batch-type thermal decomposition furnace 3A is provided with a plurality of rails 40 that are installed on an approximately horizontal surface inside the furnace body 31 with a space made from each other as well as installed between the upper nozzles 38 and the lower nozzles 39 in a side view. A tray 41 on which the panel 2 is placed is put into the furnace body 31 by way of a door 42 that can be opened and closed, being provided on the side of the furnace body 31; and the panel 2 can be placed on the rails 40 by way of the tray 41.

In the above embodiment, upper nozzles 38 and lower nozzles 39 are provided so as to sandwich the panel 2 being provided in the furnace body 31. However, the arrangement of the nozzles spraying the superheated steam is not limited hereto, but can be changed as appropriate.

Figure 7:
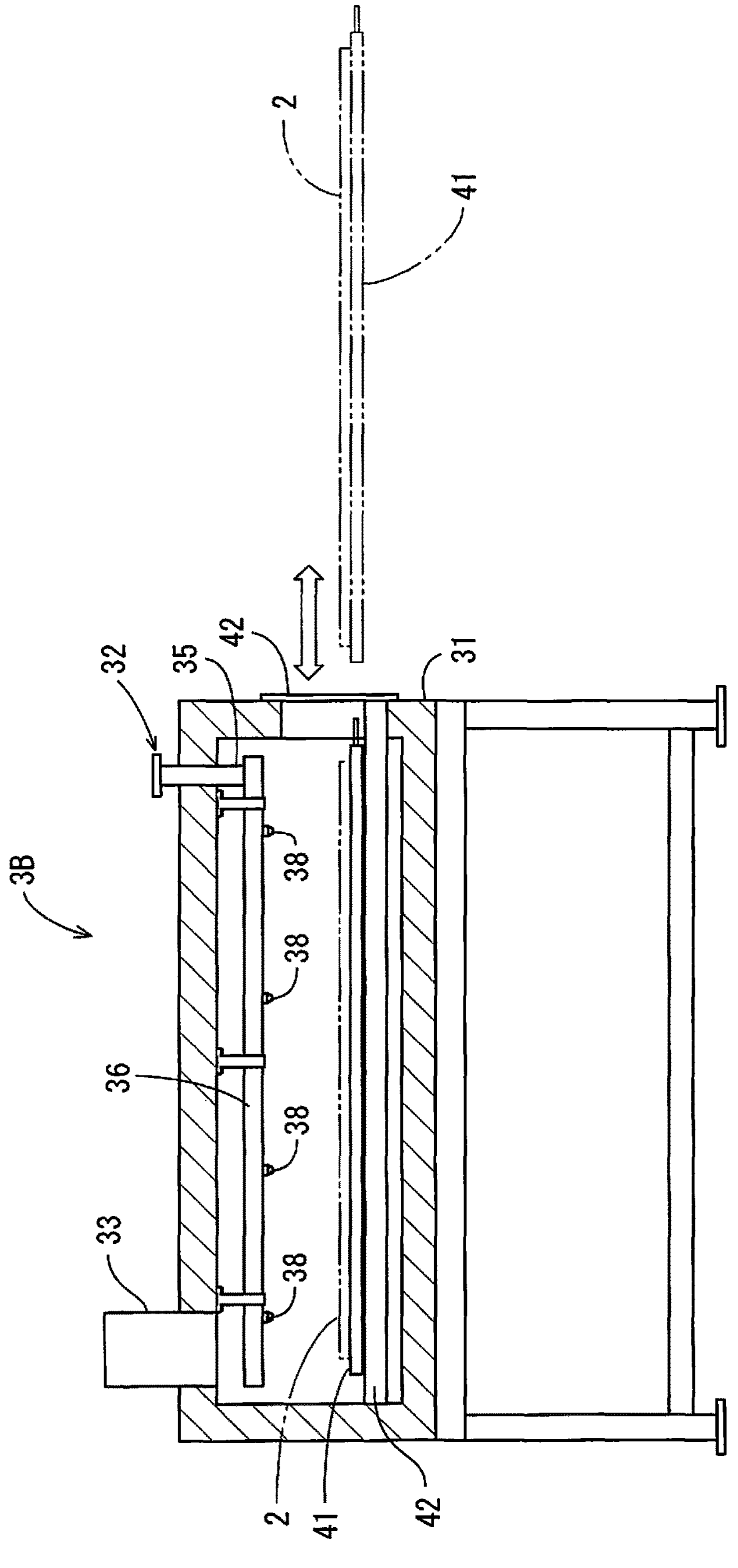
FIG. 7 is a schematic side view showing another example of a thermal decomposition furnace.

As the thermal decomposition furnace 3B shown in FIG. 7, the height of the internal space of the furnace body 31 (the size of the internal space of the thermal decomposition furnace 3 in the panel thickness) may be reduced, by removing a lower steam pipe portion 37 and the lower nozzles 39 from the structure of FIG. 6. Thereby, it is possible to reduce the energy that is necessary for raising the temperature of the internal space of the furnace body 31 to be high. Such a structure as aforementioned is also applicable to the thermal decomposition furnace 3 shown in FIG. 2 and FIGS. 4A and 4B.

In addition, an exhaust pipe being connected to the vacuum suction device may be connected to the furnace body 31. In this case, by supplying the superheated steam to the furnace body 31 after vacuuming the interior of the furnace body 31 so as to be in a low oxygen state, it is possible to heat the panel 2 in an atmosphere with a low oxygen level.

Figure 8:
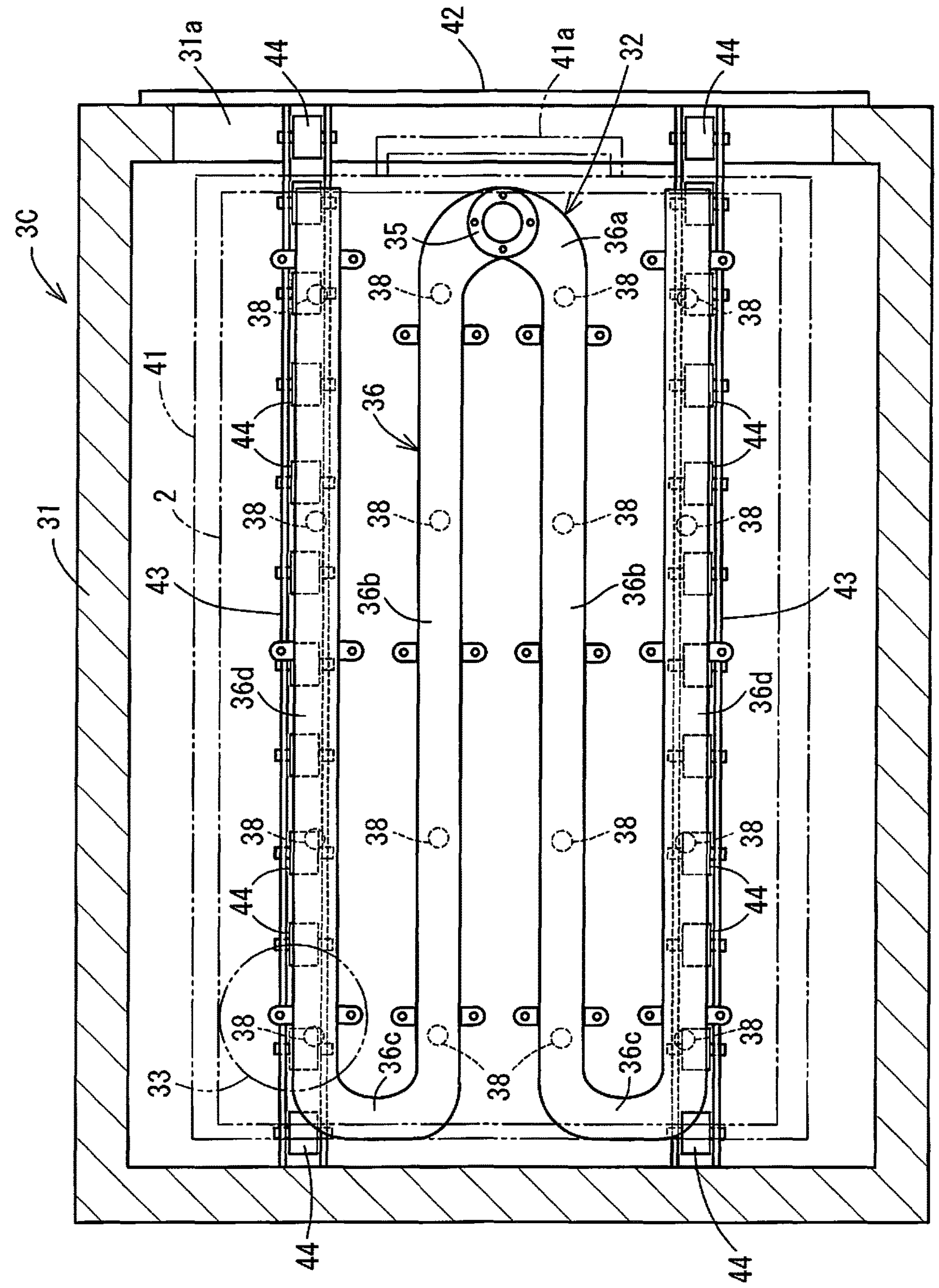
FIG. 8 is a schematic plane view showing another example of a thermal decomposition furnace.
Figure 9:
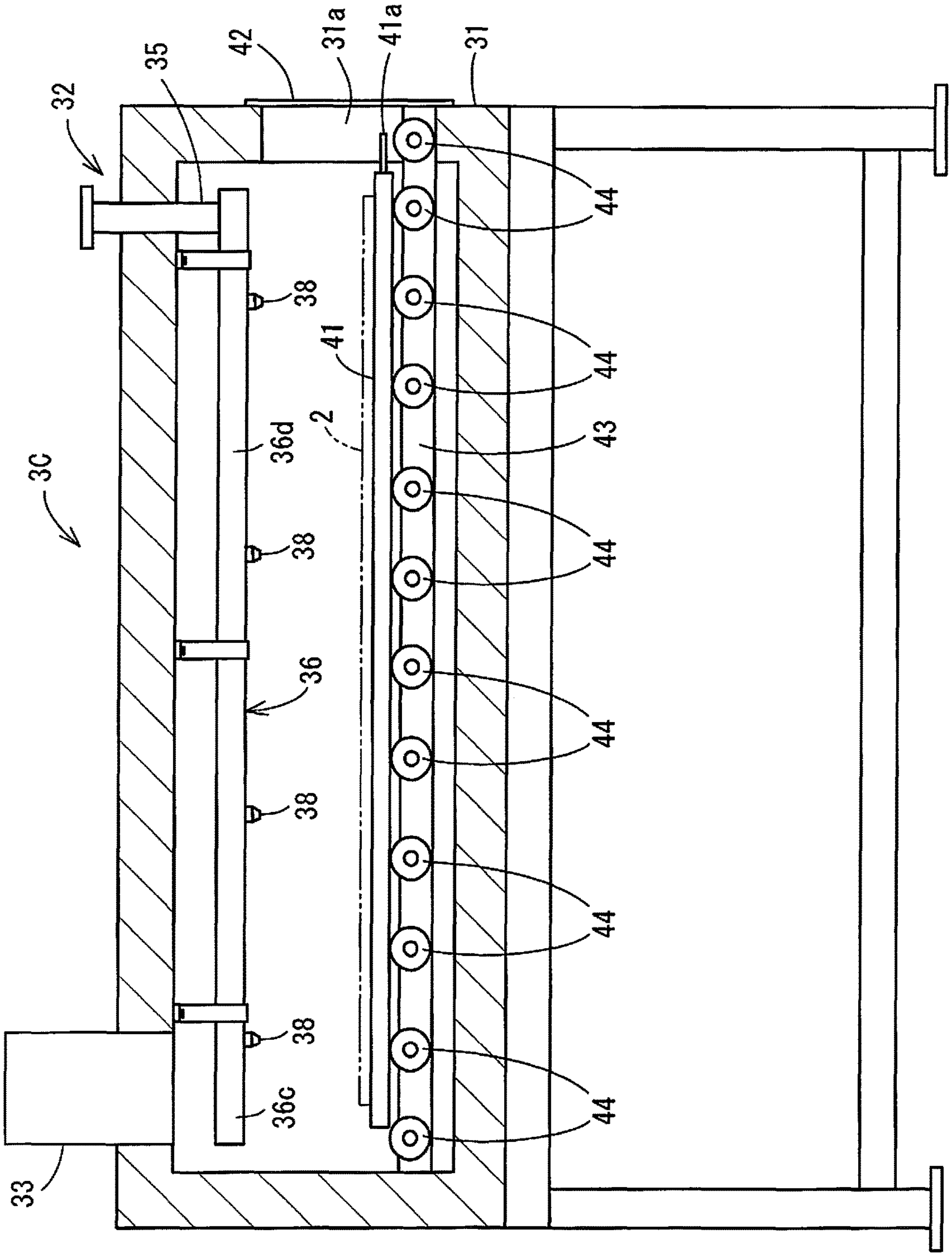
FIG. 9 is a schematic side view showing the thermal decomposition furnace.

Next, an example of the thermal decomposition furnace will be described with reference to FIG. 8 and FIG. 9. FIG. 8 is a schematic plane view showing another example of the thermal decomposition furnace. FIG. 9 is a schematic side view showing the thermal decomposition furnace. In FIG. 8, the furnace body 31 is shown cross-sectionally, going through an opening 31*a*. In FIG. 9, the furnace body 31 is shown vertically, going through a gas discharge pipe 33.

A thermal decomposition furnace 3C of the present embodiment is configured in such a manner that an opening 31*a* through which a tray 41 can be put in and taken out is provided on one side of the furnace body 31 of an approximately rectangular box type; and that the opening 31*a* can be closed by a door 42 that can be opened and closed. In FIG. 8 and FIG. 9 or the like, the furnace body 31 is shown cross-sectionally as well as integrally, but the furnace body 31 may be constructed by assembling a plurality of members.

The thermal decomposition furnace 3C is provided with a superheated steam introducing pipe 32 that has a main steam pipe portion (main pipe portion) 35 introducing the superheated steam to the furnace body 31; and an upper steam pipe portion (branch pipe portion) 36. The upper steam pipe portion 36 is placed inside the furnace body 31. As shown in FIG. 8, the upper steam pipe portion 36 is provided in a multiple-time repeated zigzag pattern in an approximately horizontal plane. The lower end of the main steam pipe portion 35 that extends vertically penetrating through the top part of the furnace body 31 is connected to the upper surface of the halfway section of the upper steam pipe portion 36.

As shown in FIG. 8 and FIG. 9, the main steam pipe portion 35 is installed to the part of the top of the furnace body 31 being close to the door 42 (location close to the opening 31*a*). The upper steam pipe portion 36 is comprised of a forked branch portion 36*a* that is provided to the connection location with the main steam pipe portion 35; and a pair of stretching-backward portions 36*b* and 36*b* that extend from the branch portion 36*a* to the back of the furnace body 31 (the side that is opposite to the side having an opening 31*a*); a pair of curved portions 36*c* and 36*c* that are bent back toward the door 42 so as to be away from the pair of stretching-backward portions 36*b* and 36*b*, respectively; and a pair of stretching-frontward portions 36*d* and 36*d* that extend from the curved portions 36*c* and 36*c* to the vicinity of the door 42. In the present embodiment, the upper steam pipe portion 36 is provided in an approximately M-shaped manner in the plane view.

A plurality of the upper nozzles 38 are provided to the lower surface of the upper steam pipe portion 36, facing the panel 2 being provided in the furnace body 31. In the present embodiment, four upper nozzles 38 are provided, with a space between each other, to each of the stretching-backward portions 36*b* and 36*b* and the stretching-frontward portion 36*d* of the upper steam pipe portion 36. In the present embodiment, the upper nozzles 38 are arranged longitudinally and horizontally, respectively (for example, in the inserting and ejecting direction of a tray 41, and in the direction being orthogonal to the aforementioned inserting and ejecting directions in the horizontal surface), along a horizontal surface that is parallel to the panel 2 inside the thermal decomposition furnace 3. In this way, by installing a plurality of upper nozzles 38 with a space between each other, facing the panel 2 being provided in the furnace body 31, it is possible to reduce the temperature variation in each area of the panel 2 and shorten the time of the decomposition treatment of the panel.

In the thermal decomposition furnace 3C, a plurality of upper nozzles 38 are provided in a lattice pattern in a plane view. However, the arrangement of the upper nozzles 38 is not limited to the aforementioned pattern, but the upper nozzles 38 may be arranged, for example, in a zigzag pattern or in an irregular pattern. Furthermore, in the thermal decomposition furnace 3C, a lower steam pipe portion 37 and a plurality of lower nozzles 39 may be installed below the panel 2 in the same manner as in the thermal decomposition furnace 3A shown in FIG. 6. In this case, a plurality of the lower nozzles 39 are placed with a space between each other, facing the lower surface of the panel 2 being disposed in the furnace body 31. The shape of the lower steam pipe portion 37 being provided with a plurality of the upper nozzles 38 and the arrangement of the lower nozzles 39 are the same as the upper steam pipe portion 36; but the shape and the arrangement of the nozzles may be different between the upper steam pipe portion 36 and the lower steam pipe portion 37.

As shown in FIG. 8 and FIG. 9, in the thermal decomposition furnace 3C, a gas discharge pipe 33 being provided to the top of the furnace body 31 is installed in the vicinity of one of two back corners of the inside of the furnace body 31 in the plane view. As a result, a gas flow can be formed in the furnace body 31, flowing toward the corner being provided with the gas discharge pipe 33; thereby making it possible to suppress gas retention in the furnace body 31.

The thermal decomposition furnace 3C is provided with a pair of in-furnace roller conveyors 43 and 43 inside the furnace body 31, extending from the front side to the back. Each in-furnace roller conveyor 43 is provided with a plurality of in-furnace rollers 44 that can rotate in every direction around a roller shaft extending in a direction orthogonal to the inserting and ejecting direction of the tray 41 in a horizontal surface. The in-furnace roller conveyors 43 and 43 are provided with a space from each other in a direction orthogonal to the inserting and ejecting direction of the tray 41 in a horizontal surface, so that the tray 41 can be supported in the furnace body 31. By providing the in-furnace roller conveyors 43 and 43, the tray 41 with the panel 2 placed thereon can be inserted into and ejected from the furnace body 31 smoothly.

Figure 10:
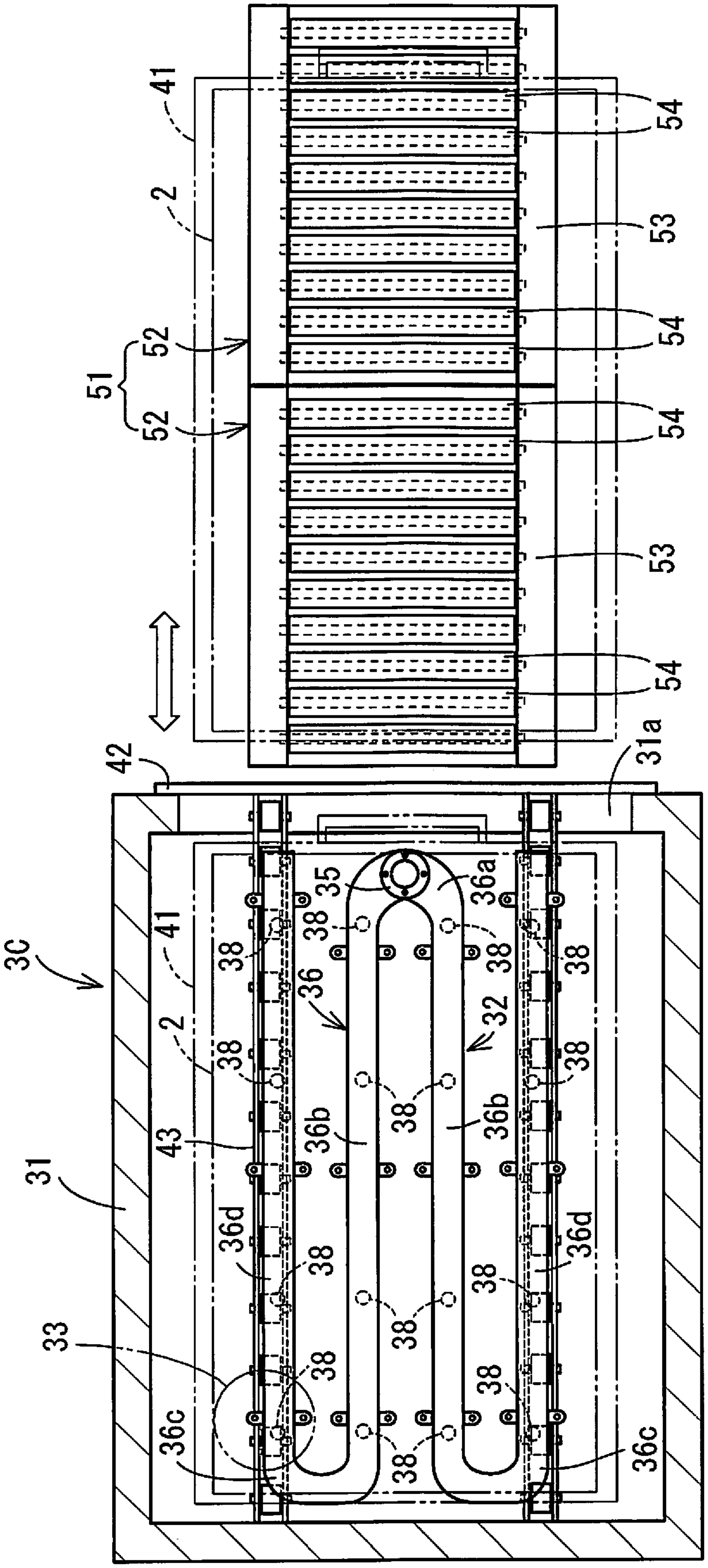
FIG. 10 is a schematic plane view showing the thermal decomposition furnace and a tray conveying carrier.
Figure 11:
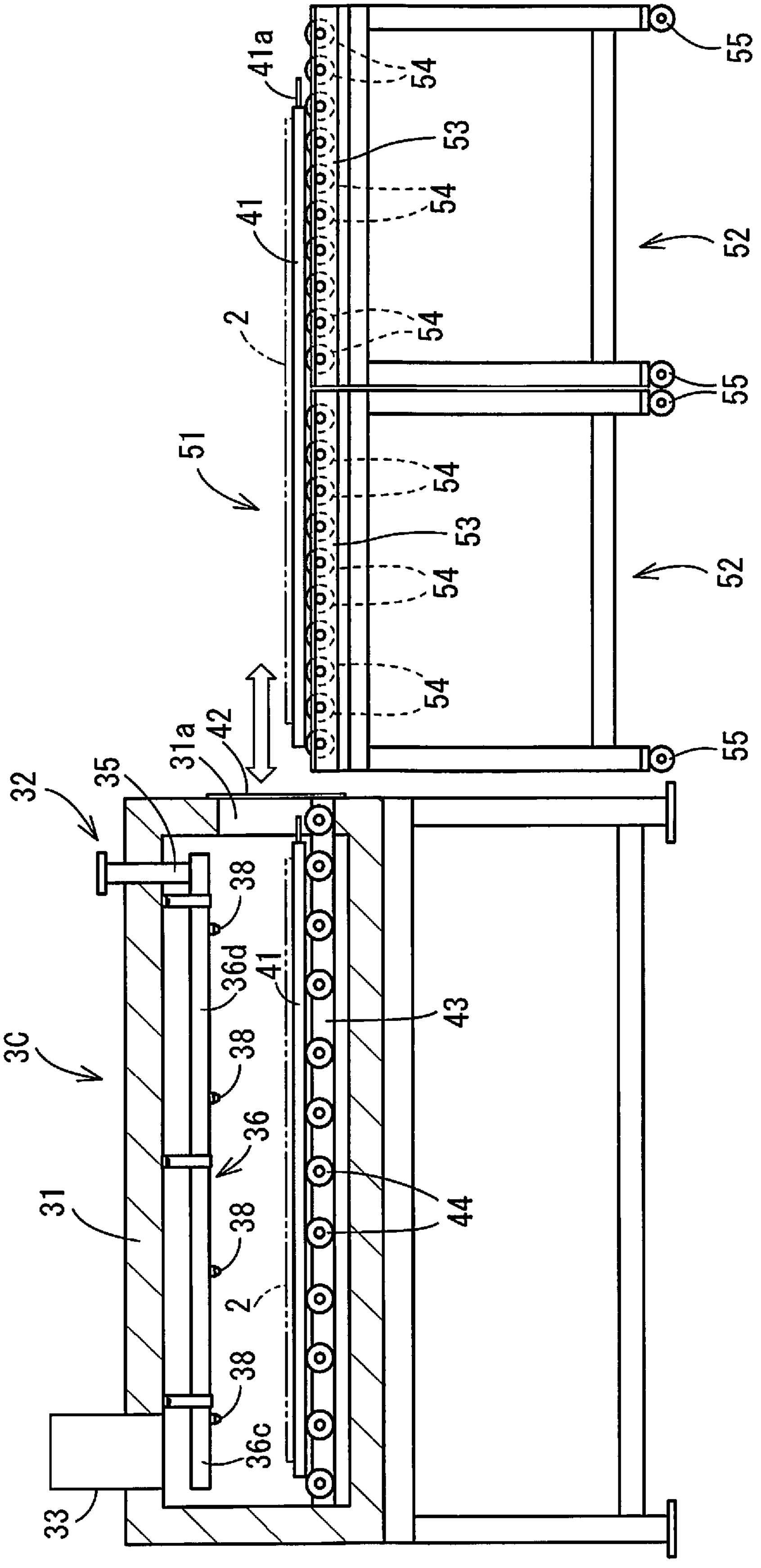
FIG. 11 is a schematic side view showing the thermal decomposition furnace and the tray conveying carrier.

As shown in FIG. 10 and FIG. 11, when a tray conveying carrier 51 with roller conveyors is used to insert the tray 41 and a panel 2 into the thermal decomposition furnace 3C and eject the tray 41 and the panel 2 from the thermal decomposition furnace 3C, inserting and ejecting activities can be conducted easily. The tray conveying carrier 51 is composed of two carriers 52 and 52 having the same structure. Each carrier 52 is provided with a roller conveyor 53 having a plurality of rollers 54, at a location almost as high as the in-furnace roller conveyor 43 of the thermal decomposition furnace 3C. A plurality of wheels 55 are installed to the lower portion of the carrier 52, and the carrier 52 can move by rolling of the wheels 55. The two carriers 52 and 52 can be connected to and separated in the conveying direction of the roller conveyors 53.

By installing the tray 41 on the roller conveyor 53 of the tray conveying carrier 51, wherein two carriers 52 and 52 are connected, and by placing the tray conveying carrier 51 in the vicinity of the door 42 of the thermal decomposition furnace 3C, the tray 41 with the panel 2 placed thereon can be inserted into the furnace body 31 and ejected from the furnace body 31 easily, by utilizing the rolling of the rollers 44 and 54 of the in-furnace roller conveyor 43 and the roller conveyor 53. Furthermore, since the tray conveying carrier 51 is provided with wheels 55, the tray conveying carrier 51 can move easily and also can be moved easily between the installation position of the tray conveyance carrier 51 (See FIG. 10 and FIG. 11.) and the storage space. Since the tray conveyance carrier 51 is composed of two separable carriers 52 and 52, the carriers 52 and 52 can be separated and stored at a distant location from each other; so that it is possible to effectively utilize an empty space around the installation location of the thermal decomposition apparatus as a storage space for the carriers 52. The tray conveying carrier 51 is not limited to such a structure as can be separated into two carriers 52 and 52, but may be composed of one carrier or three or more carriers.

A handle 41*a* that an operator can hold is provided to one side of the tray 41, and the operator can hold the handle 41*a* and slide the tray 41 on the in-furnace roller conveyor 43 and the roller conveyor 53 easily. The structure of the part of the tray 41 where the panel 2 is placed onto is not limited specifically, but may be a plate or a mesh, for example.

Figure 12A:
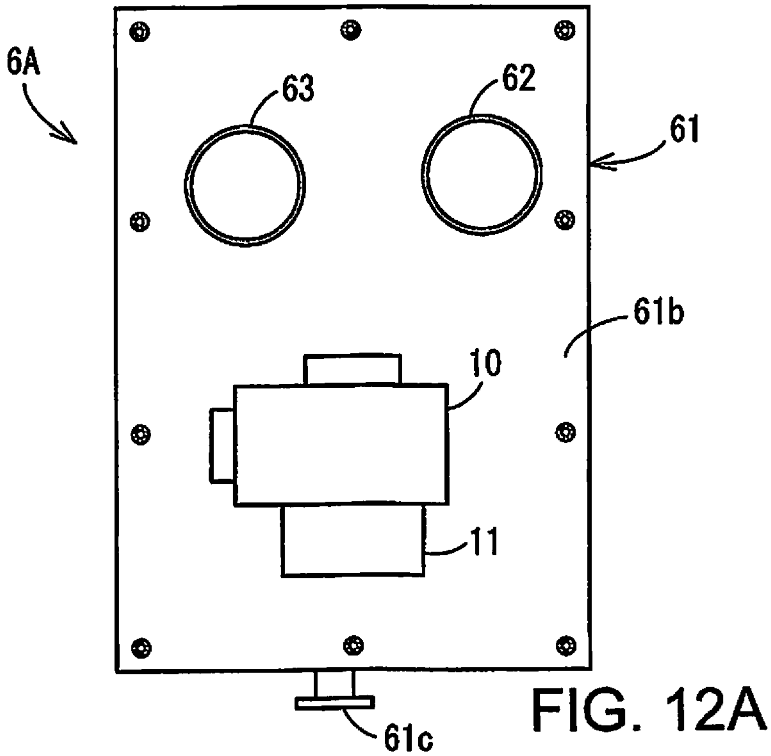
Figure 12B:
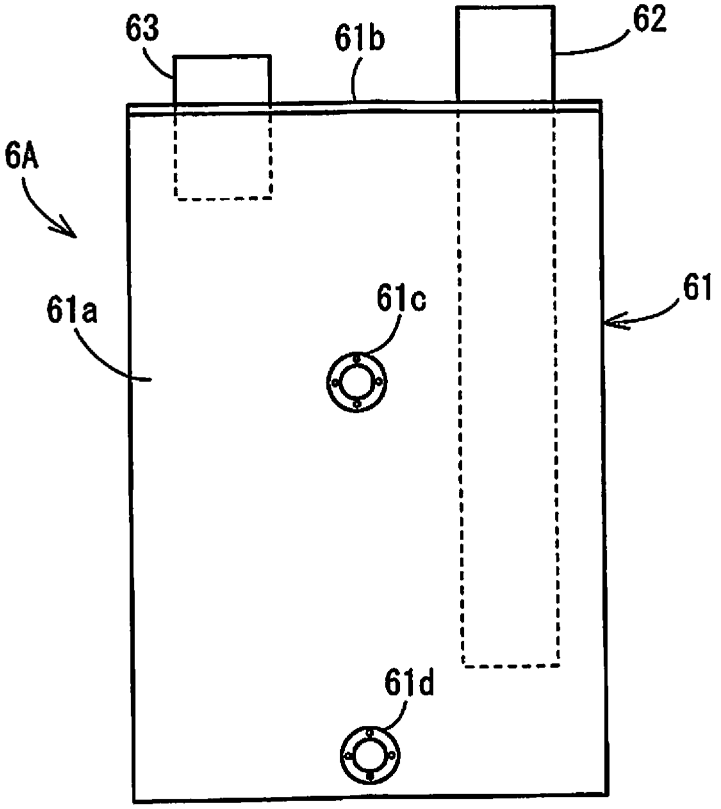

Next, an example of a gas cooling device will be described with reference to FIGS. 12A and 12B. FIGS. 12A and 12B are schematic views showing another example of the gas cooling device; wherein, FIG. 12A is a plane view and FIG. 12B is a side view.

A gas cooling device 6A of this embodiment is provided with a closed tank 61, an exhaust gas introducing pipe 62 and a gas discharge pipe 63. The closed tank 61 is provided with a tank body 61*a* being of an approximately rectangular box having an opening made in the top thereof; and a tank lid 61*b* that closes the opening of the top of the tank body 61*a*. The tank lid 61*b* is installed to the top of the tank body 61*a* with bolts or the like so as to be removable.

An upper connecting hole 61*c* and a lower connecting hole 61*d* that join the inside of the tank body 61*a* to the outside are provided on one side of the tank body 61*a*. The upper connecting hole 61*c* is provided at a position slightly higher than the halfway of the height of one side of the tank body 61*a*. The lower connecting hole 61*d* is provided to the bottom of one side of the tank body 61*a*. For example, by injecting the water into the tank body 61*a* from the upper connecting hole 61*c* in a state in which the discharge of liquid from the lower connecting hole 61*d* is prohibited, it is possible to store the water in the tank body 61*a*

In the tank lid 61*b*, an exhaust gas introducing pipe 62 is vertically inserted near one of the two corners being at a distance from the connecting holes 61*c* and 61*d* in a plane view; and a gas discharge pipe 63 is vertically inserted near the other corner. The upper portion of the exhaust gas introducing pipe 62 and the upper portion of the gas discharge pipe 63 are provided so as to project upward from the upper surface of the tank lid 61*b*. The lower end of the exhaust gas introducing pipe 62 is arranged at a position close to the lower part inside the tank body 61*a* so as to be immersed in the water being contained in the closed tank 61. The lower end of the gas discharge pipe 63 is located in the upper part inside the closed tank 61 so as not to be immersed in the water being contained in the closed tank 61. The opening being provided in the tank lid 61*b* for the pipes 62 and 63 to be inserted and the gap between the pipes 62 and 63 are sealed, for example, by welding.

In addition, on the upper surface of the tank lid 61*b*, a space is provided, in which an exhaust fan 10 and a filter 11 (Illustration is omitted in FIG. 12B.) can be installed between the connecting holes 61*c* and 61*d* and the pipes 62 and 63 in a plane view. By installing the exhaust fan 10 on the tank lid 61*b*, the discharge pipe 9 connecting the gas discharge pipe 63 and the exhaust fan 10 (See FIG. 1 and FIG. 3 or the like.) can be shortened, and at the same time, the entire thermal decomposition apparatus can be made compact.

Figure 13:
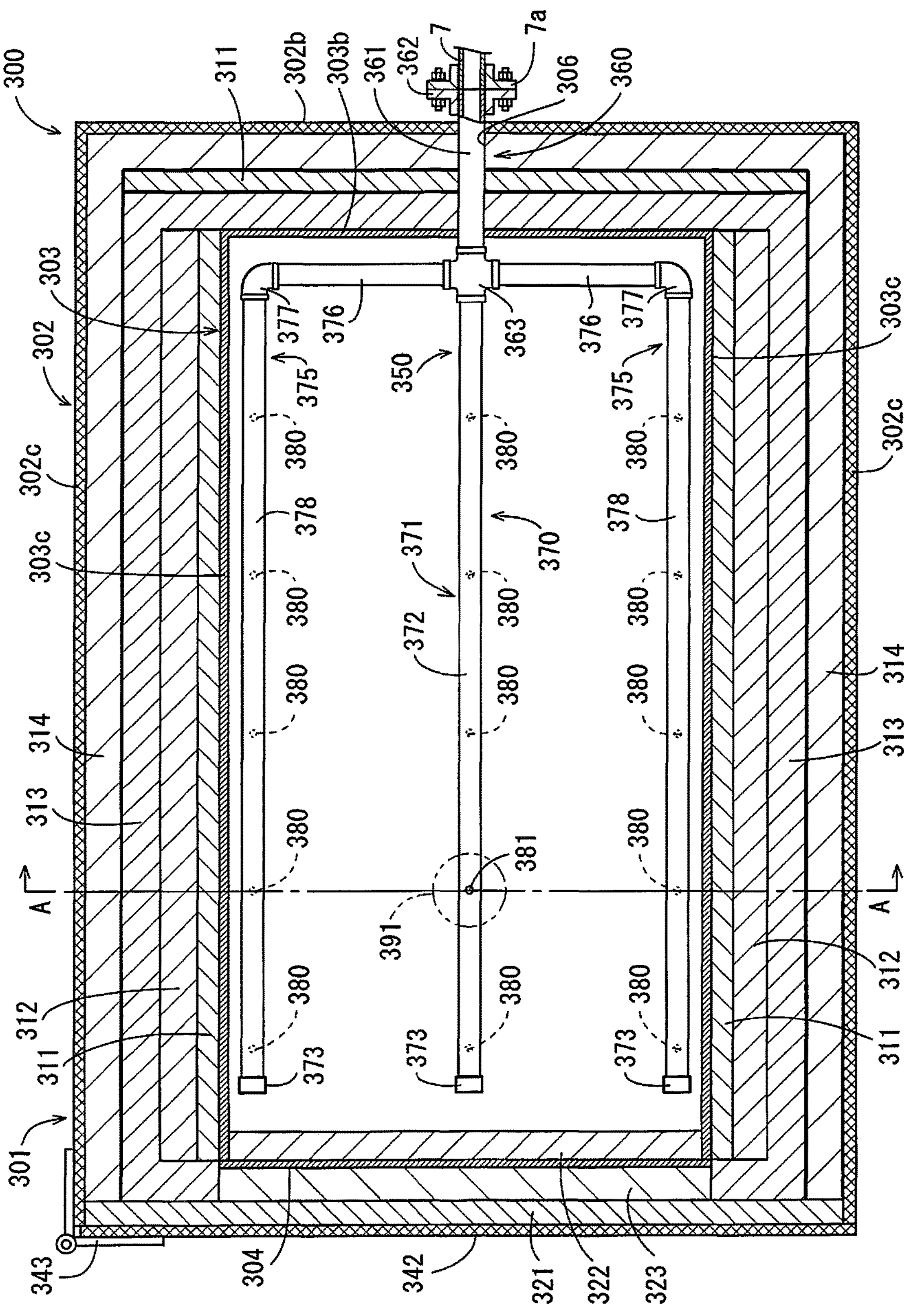
FIG. 13 is a schematic cross-sectional plane view showing another example of a thermal decomposition furnace.
Figure 14:
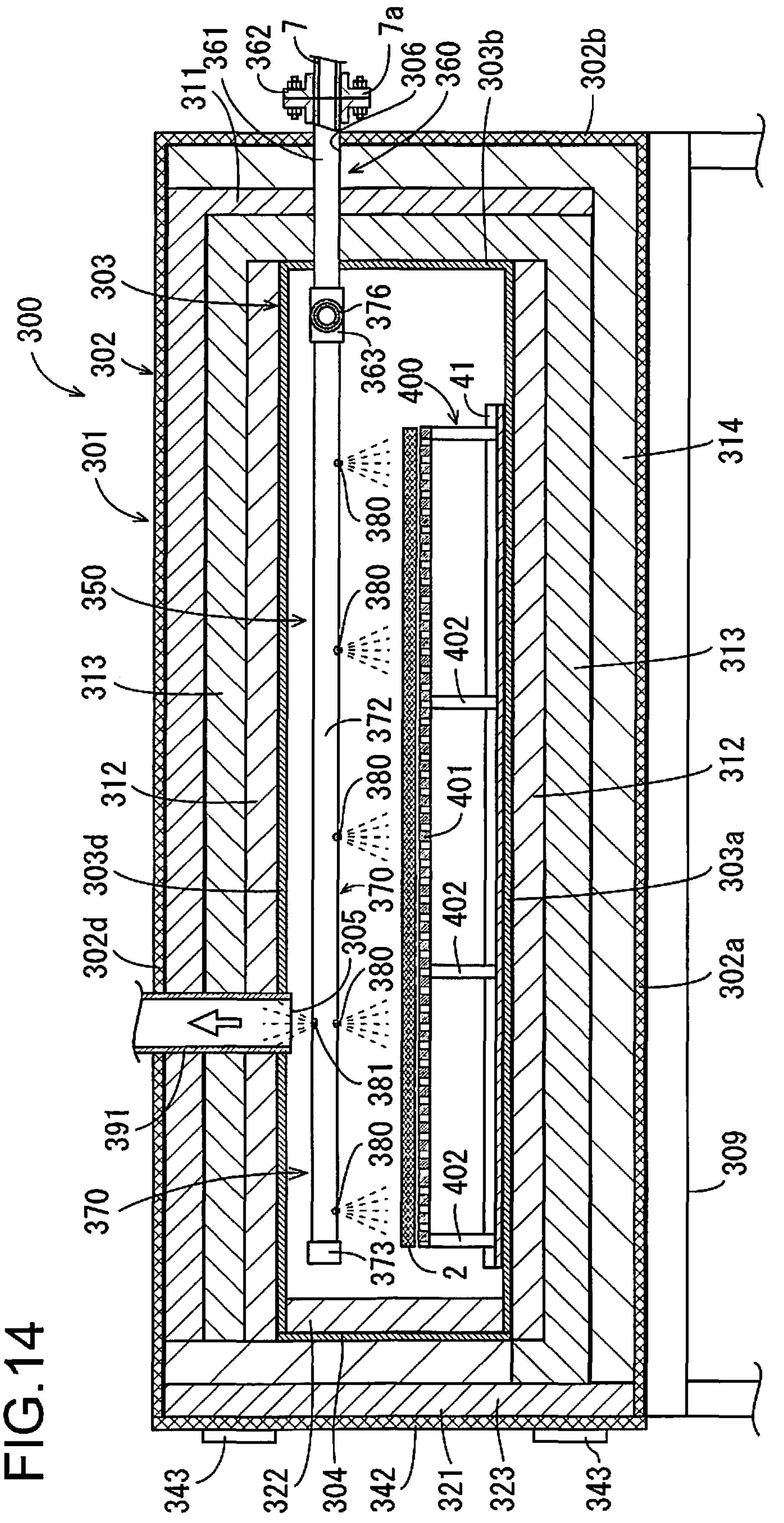
FIG. 14 is a schematic cross-sectional side view showing the thermal decomposition furnace.
Figure 15:
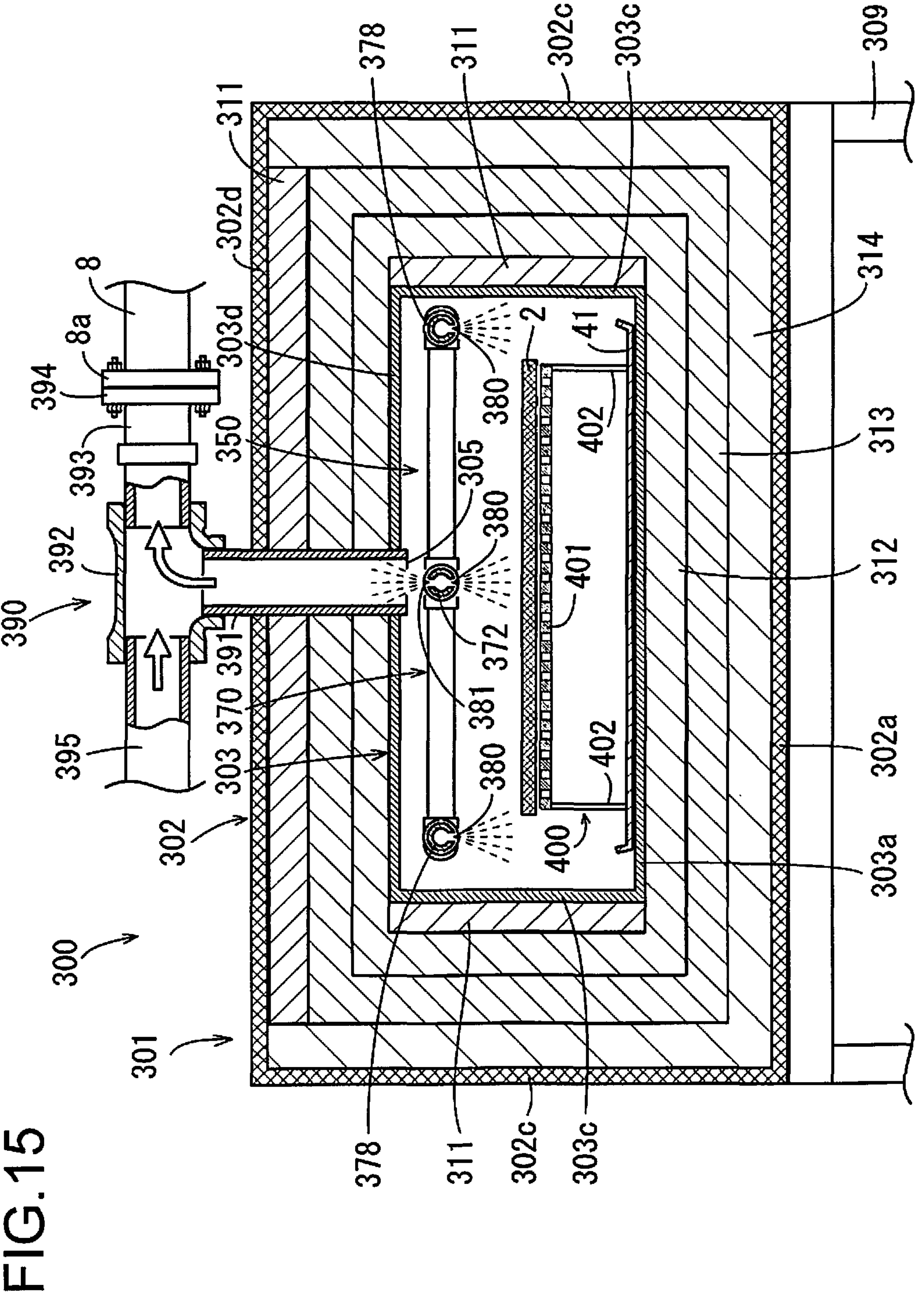
FIG. 15 is a cross-sectional view along the line A-A of FIG. 13.
Figure 16:
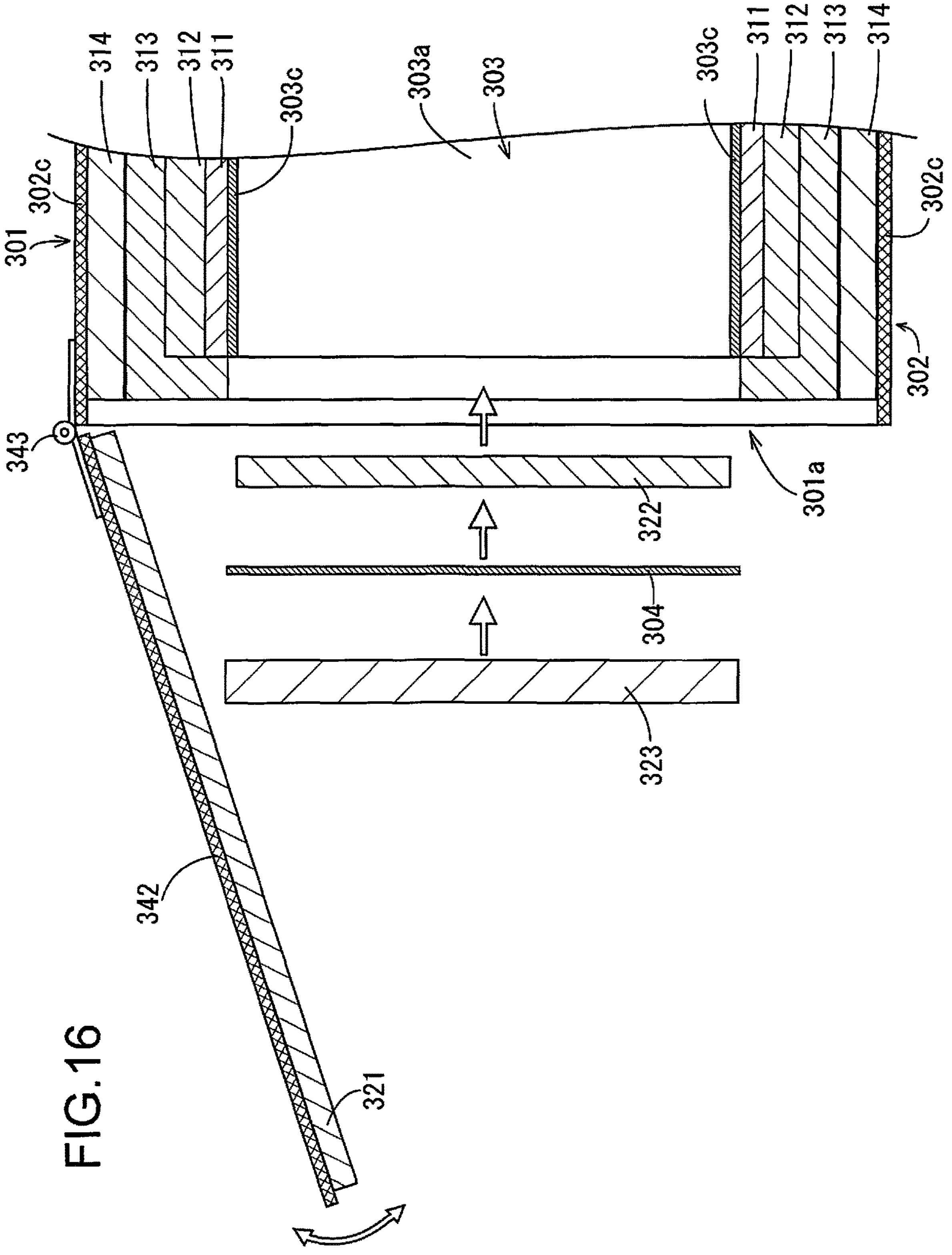
FIG. 16 is a transverse cross-sectional view showing a state in which an opening of the thermal decomposition furnace is opened.

Next, another example of the thermal decomposition furnace will be described with reference to FIG. 13 through FIG. 16. FIG. 13 is a schematic plane view showing another example of the thermal decomposition furnace. FIG. 14 is a schematic side view showing the thermal decomposition furnace. FIG. 15 is a cross-sectional view along the line A-A of FIG. 13. FIG. 16 is a transverse sectional view showing a state in which an opening of the thermal decomposition furnace is opened. In FIG. 13 and FIG. 16, the furnace body 301 of the thermal decomposition furnace 300 is shown in a cross section going through the opening 301*a*. In FIG. 14, the furnace body 301 is shown in a central longitudinal section going through the opening 301*a*.

<Overall Structure>

The thermal decomposition furnace 300 of the present embodiment is constructed in such a manner that one side of a furnace body 301 of an approximately rectangular box type, being supported by a support shelf 309, is provided with an opening portion 301*a* (See FIG. 16.) through which a tray 41 can be taken in and out; and that the opening portion 301*a* can be closed by a door 342 that can be opened and closed.

<Internal Structure>

The furnace body 301 is provided with an outer wall 302 of a box type having an opening in the opening portion 301*a* (See FIG. 16.); and an inner wall 303 of a box type being provided inside the outer wall 302. The inner wall 303 has an opening in the opening portion 301*a*. The outer wall 302 and the inner wall 303 are made of steel plate. The panel 2 being placed on the tray 41 is accommodated inside the inner wall 303, together with the tray 41.

A thermal insulation sheet layer 311, a heat storage material layer 312, a thermal insulation material layer 313 and a regular brick layer 314 are formed between the outer wall 302 and the inner wall 303. The regular brick layer 314 is formed by lining the bottom surface 302*a*, the rear surface 302*b*, and the right and left side surfaces 302*c* of the outer wall 302 with red bricks. The regular brick layer 314 works as a thermal insulation material.

Inside the regular brick layer 314, a heat storage material layer 312 is formed by arranging heat storage bricks (refractory bricks) so as to enclose the top, the bottom and the left and right surfaces of the inner wall 303 (the bottom surface 303*a*, the right and the left side surfaces 303*c* and the top surface 303*d* of the inner wall). A thermal insulation sheet layer 311 made of a flexible sheet-like thermal insulation material such as an insulated felt, for example, is formed between the right and left side surfaces 303*c* of the inner wall 303 and the heat storage material layer 312.

A thermal insulation material layer 313 made of insulated bricks (insulated fire bricks), being arranged so as to enclose the heat storage material layer 312, is formed inside the regular brick layer 314. The thermal insulation material layer 313 also covers the rear surface 303*b* of the inner wall 303.

A thermal insulation sheet layer 311 is formed between the regular brick layer 314 being lined on the rear surface 302*b* of the outer wall 302 and the thermal insulation material layer 313. The thermal insulation sheet layer 311 is also formed between the top surface 302*d* of the outer wall 302 and the thermal insulation material layer 313. As shown in FIG. 13 through FIG. 16, the thermal insulation sheet layer 311 is provided between the rear surface 303*b* of the inner wall 303 and the rear surface 302*b* of the outer wall 302; between the side surface 303*c* of the inner wall 303 and the side surface 302*c* of the outer wall 302; and between the top surface 303*d* of the inner wall 303 and the top surface 302*d* of the outer wall 302, respectively.

As shown in FIG. 13 through FIG. 15, the opening of the inner wall 303 is located deeper inside than the opening of the outer wall 302. The thermal insulation material layer 313 is also provided with a portion being made by arranging the insulated bricks in a U-shape so as to have an upward opening of the outer wall 302 without closing the opening of the inner wall 303.

A heat storage material layer 322 for a lid being composed of a plurality of removable heat storage bricks is formed near the opening inside the inner wall 303. The opening of the inner wall 303 is closed by a removable inner lid 304. The inner lid 304 is made of steel plate. Furthermore, the inner lid 304 may be provided with a handle (Illustration is omitted.) that can be held by an operator.

A thermal insulation material layer 323 for a lid that is composed of a plurality of removable insulated bricks so as to fill the inside of the U-shaped thermal insulation material layer 313 being opened upward is formed on the outside of the inner lid 304. In this way, the opening of the outer wall 302 is closed by the U-shaped regular brick layer 314 having an upward opening, a thermal insulation material layer 313 made of insulated bricks, and a thermal insulation material layer 323 for a lid.

The door 342 that closes the opening 301*a* of the furnace body 301 (the opening of the outer wall 302) is made of steel plate. One of the right and left edges of the door 342 is rotatably connected to the opening-side end (a front end) of either of the right and left side surfaces 302*c* of the outer wall 302 by way of a hinge 343.

A thermal insulation sheet layer 321 for a lid is attached to the door 342. The thermal insulation sheet layer 321 for a lid closes the opening of the outer wall 302, with the door 342 closed, facing a regular brick layer 314 that closes the opening of the outer wall 302, a thermal insulation material layer 313 and a thermal insulation layer 323 for a lid.

As shown in FIG. 16, when the panel 2 and the tray 41 are inserted into and taken out of the inner wall 303 of the furnace body 301, the door 342 holding the thermal insulation sheet layer 321 for a lid is opened; and the thermal insulation material layer 323 for a lid, the inner lid 304 and the heat storage material layer 322 for a lid are removed, so as to make the opening of the inner wall 303 exposed.

In order to conduct thermal decomposition of the panel 2, first, the panel 2 and the tray 41 are placed inside the inner wall 303. Next, after installing the heat storage material layer 322 for a lid so as to close the opening of the inner wall 303, the inner lid 304 is installed to close the opening of the inner wall 303. Moreover, after the thermal insulation material layer 323 for a lid is installed on the front side of the inner lid 304, the door 342 is closed, so as to close the opening 301*a* of the furnace body 301 (the opening of the outer wall 302) with the thermal insulation sheet layer 321 for a lid and the door 342. Then, the door 342 is fixed to the outer wall 302 with fixtures. (Illustration is omitted.)

As shown in FIG. 13 through FIG. 15, in the furnace body 301, the top surface, the bottom surface and the right and left side surfaces of the inner wall 303 are enclosed by a heat storage material layer 312; and the opening of the inner wall 303 is closed by the heat storage material layer 322 for a lid. Thereby, when the superheated steam is introduced into the inner wall 303 from the superheated steam introducing portion 350 to be described later so as to raise the temperature inside the metal inner wall 303, heat can be stored in the heat storage material layer 312 and the heat storage material layer 322 for a lid. As a result, when the door 342 is opened and closed and the thermal decomposition treatment of the panel 2 is repeated, the time until the temperature inside the inner wall 303 reaches the desired temperature can be shortened; thereby enhancing the treatment efficiency.

Figure 17:
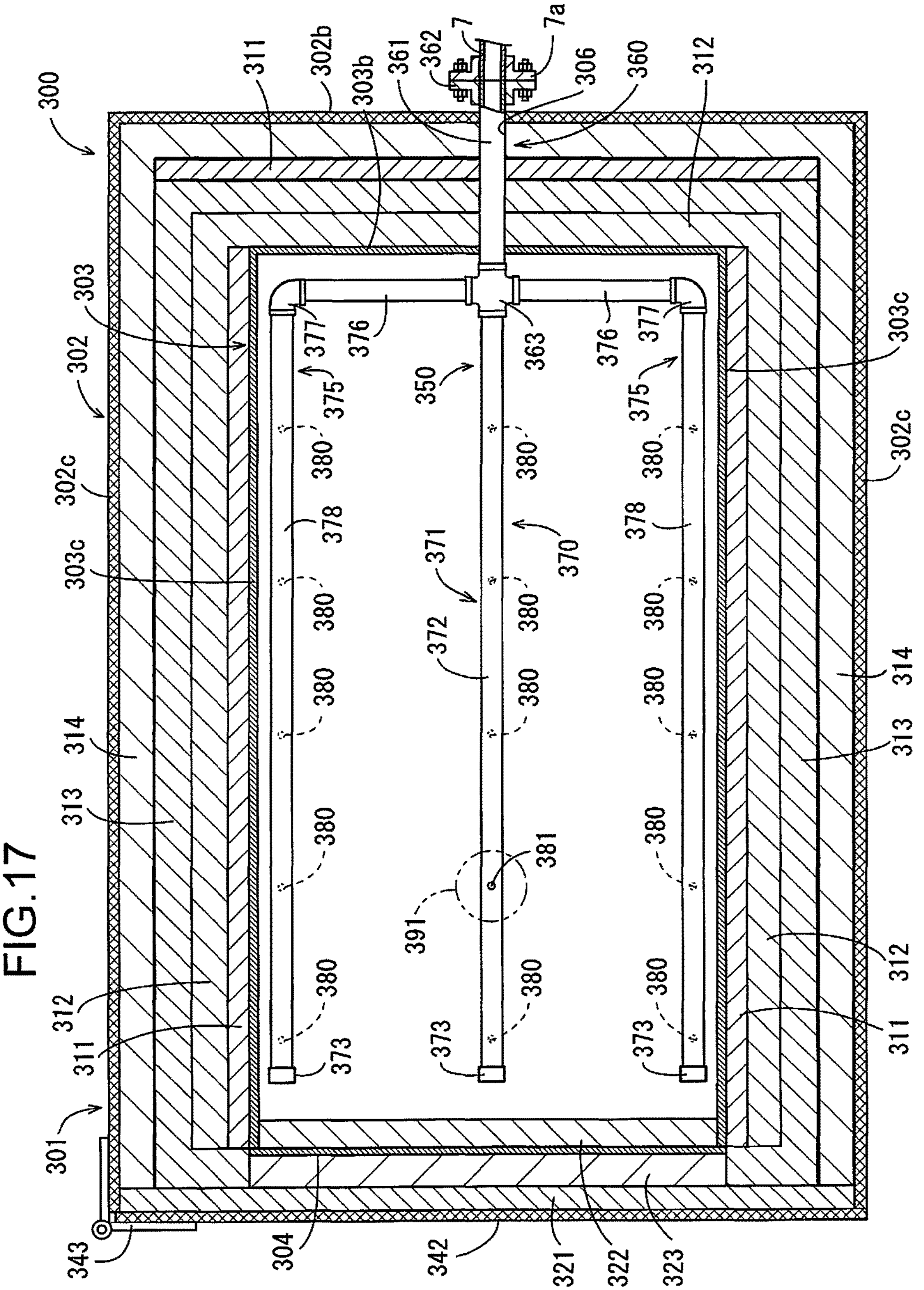
FIG. 17 is a schematic cross-sectional plane view showing another example of a thermal decomposition furnace.
Figure 18:
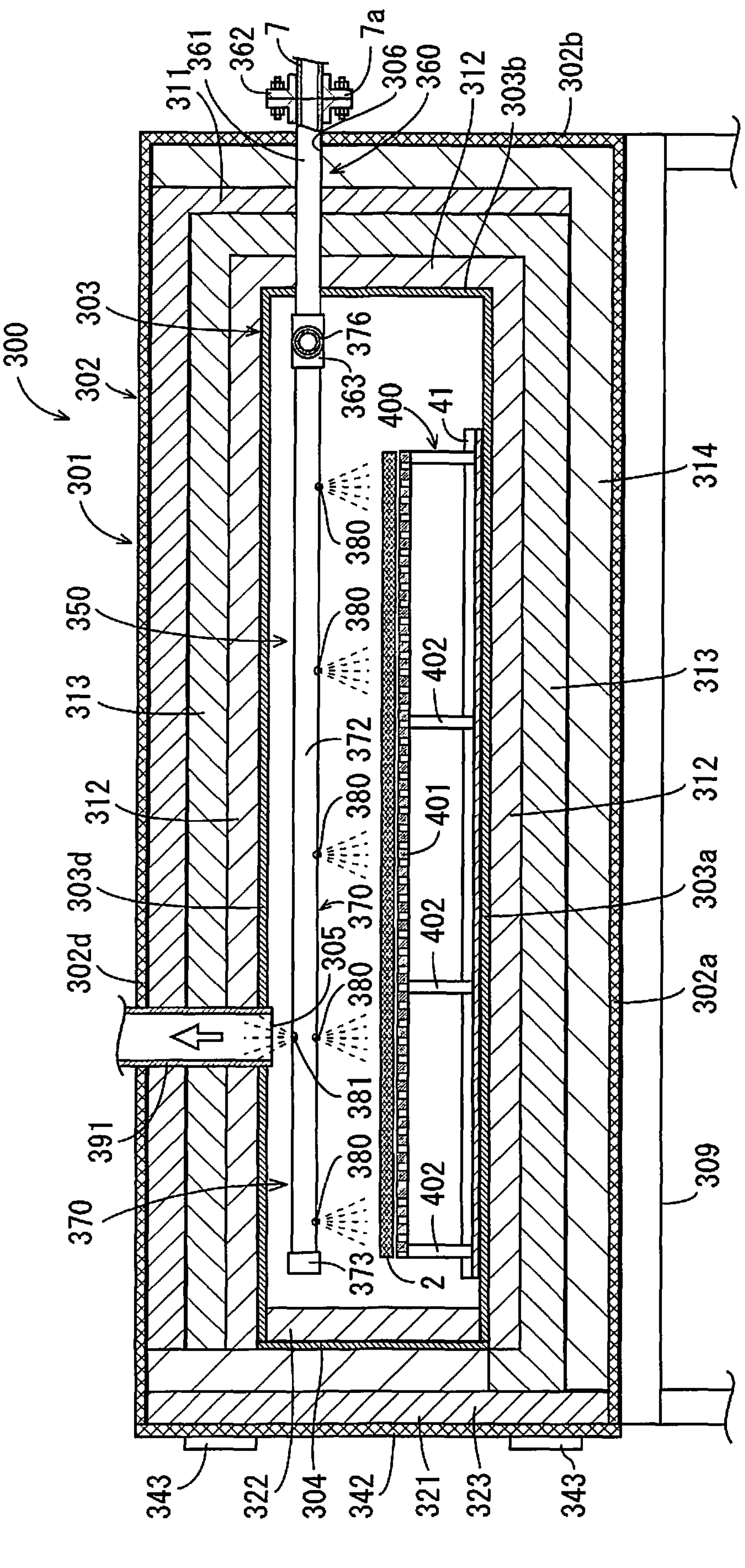
FIG. 18 is a schematic cross-sectional side view showing the thermal decomposition furnace.

As shown in FIG. 17 and FIG. 18, a heat storage material layer 312 may be provided between the rear face 302*b* of the outer wall 302 and the rear surface 303*b* of the inner wall 303. Thereby, thermal storage effect of the furnace body 301 can be further enhanced.

As shown in FIG. 13 through FIG. 15, the top surface, the rear surface and the right and left side surfaces of the inner wall 303 are enclosed by the thermal insulation material layer 313; and the thermal insulation material layer 323 for a lid is installed on the front side of the opening of the inner wall 303. Therefore, when the panel 2 is thermally decomposed, it is possible to suppress the heat inside the furnace body 301 (heat inside the inner wall 303) from being released to the outside; thereby making enhancing the treatment efficiency.

Figure 19:
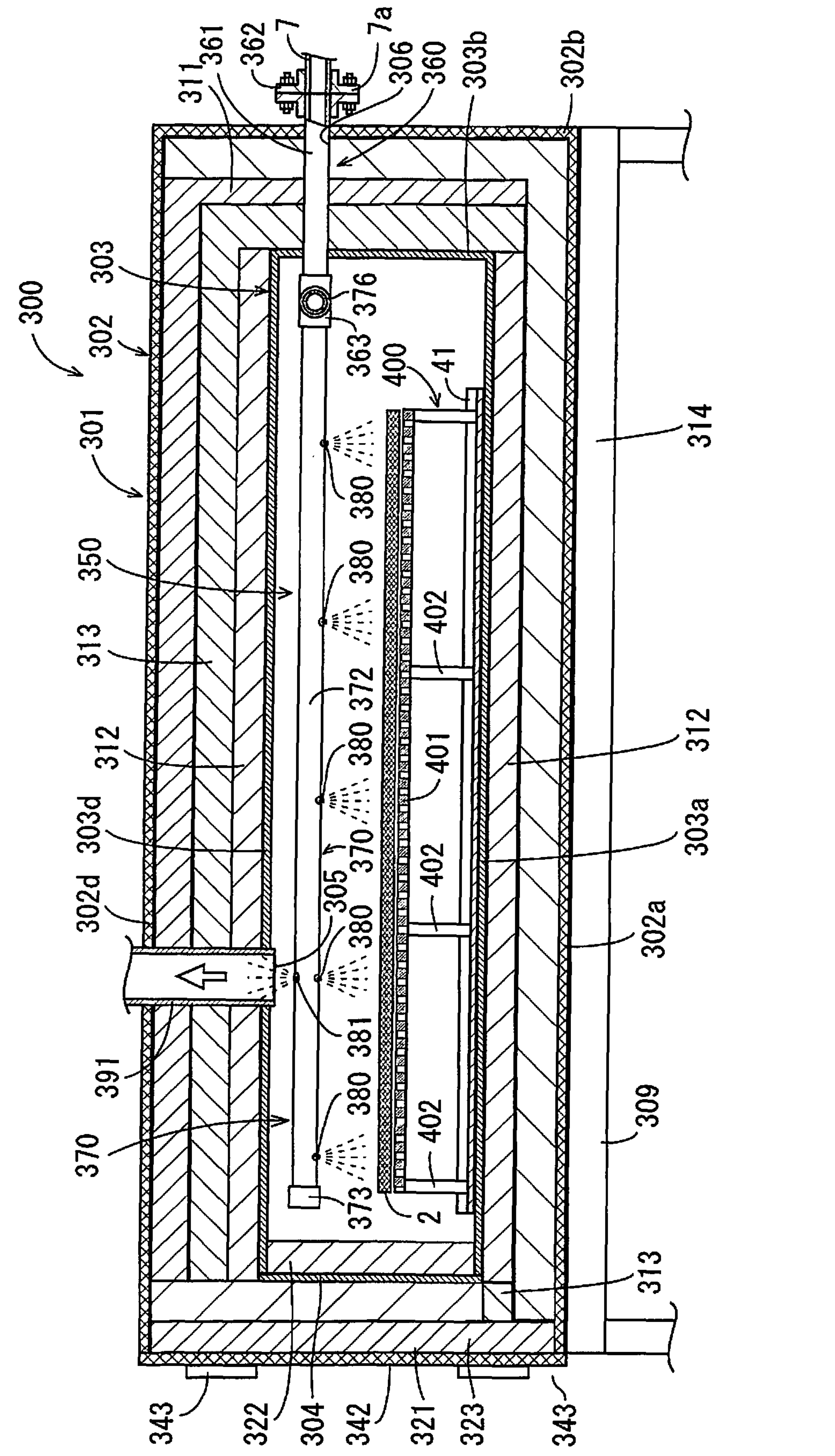
FIG. 19 is a schematic cross-sectional side view showing another example of a thermal decomposition furnace.

Furthermore, as shown in FIG. 19, thermal insulation material layer 313 may not be provided under the inner wall 303. Thereby, it is possible not only to reduce the manufacturing cost of the furnace body 301 but also to shorten the height of the furnace body 301.

As shown in FIG. 13 through FIG. 15, the thermal insulation sheet layer 311 made of a flexible sheet-like thermal insulation material is provided between the rear surface 303*b* of the inner wall 303 and the rear surface 302*b* of the outer wall 302; between the side surface 303*c* of the inner wall 303 and the side surface 302*c* of the outer wall 302; between the top surface 303*d* of the inner wall 303 and the top surface 302*d* of the outer wall 302; and between the inner lid 304 and the door 342, respectively. Thereby, the thermal expansion of the inner wall 303 made of a steel plate can be absorbed by the thermal insulation sheet layer 311, so that it is possible to prevent the damages of the heat storage material layer 312 and the thermal insulation material layer 313 (that are of the bricks in the present embodiment) caused by the thermal expansion of the inner wall 303.

Figure 20:
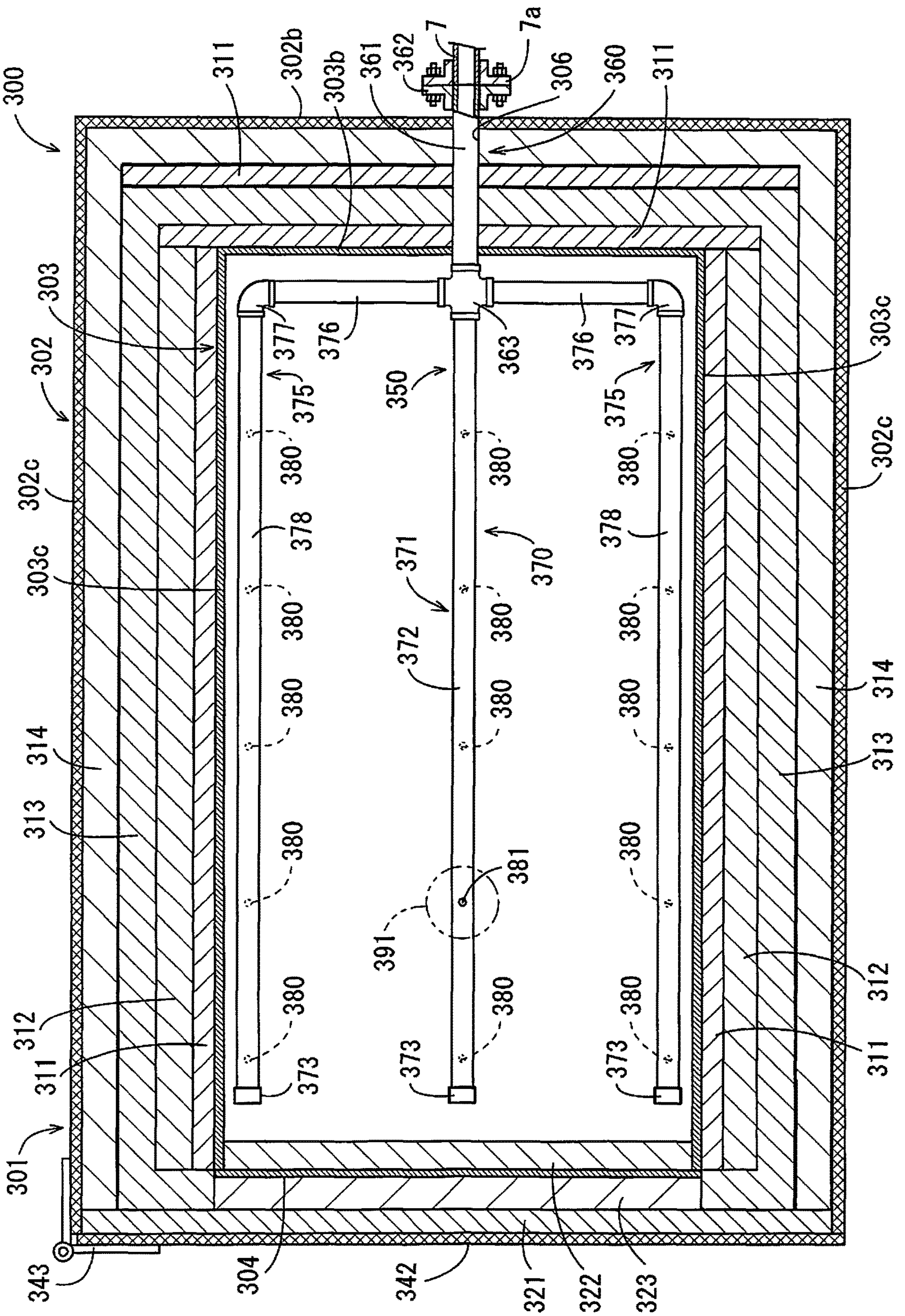
FIG. 20 is a schematic cross-sectional plane view showing another example of the thermal decomposition furnace.
Figure 21:
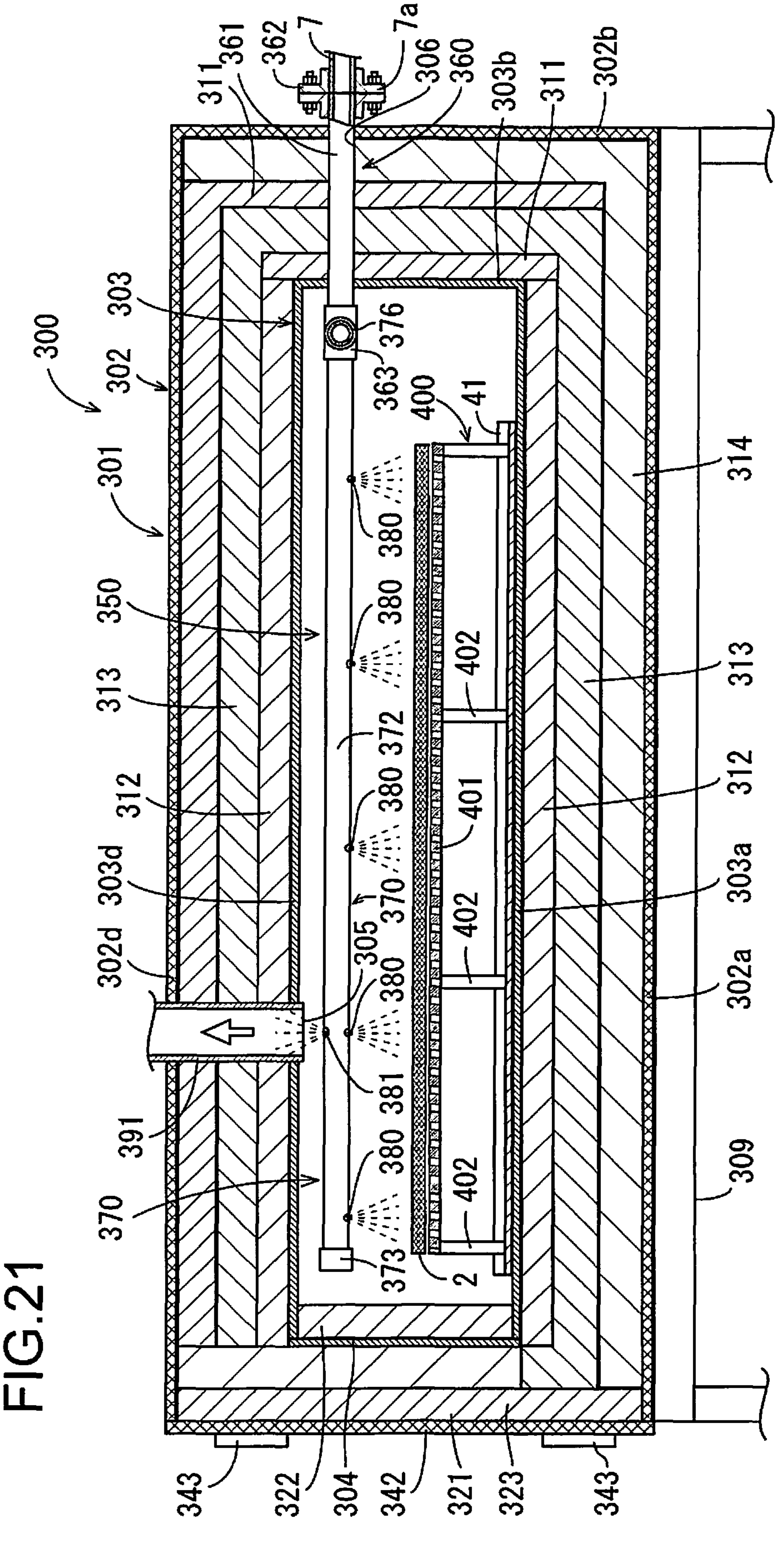
FIG. 21 is a schematic cross-sectional side view showing the thermal decomposition furnace.

Furthermore, the position where the thermal insulation sheet layer 311 is installed is not limited to the above-mentioned embodiment; but if the thermal insulation sheet layer 311 is installed between the outer wall 302 and the inner wall 303 so as to enclose the rear surface, the right and left side surfaces and the top surfaces of the inner wall 303, the thermal expansion of the inner wall 303 can be absorbed. For example, as shown in FIG. 20 and FIG. 21, the thermal insulation sheet layer 311 may be provided so as to be adjoining to the rear surface 303*b*, the right and left side surfaces 303*c* and the top surface 303*d* of the inner wall 303.

Since a plurality of bricks are placed on the inner wall 303, a reinforcement member that suppresses the deflection of the top part 303*d* of the inner wall 303 may be provided. This reinforcing member can be formed, for example, by fixing the steel plate ribs, which extend along the diagonal line of the top surface 303*d* of the inner wall 303, to the upper part of the top surface 303*d* of the inner wall 303. In this case, by placing a steel plate facing the top surface 303*d* of the inner wall 303 on the reinforcement member, and then placing the bricks on the steel plate, it becomes easy to arrange the bricks on the upper part of the inner wall 303. In such a configuration as aforementioned, it is preferable to fill the gap between the top surface 303*d* of the inner wall 303 and the steel plate thereon with a thermal insulation material such as thermal insulation felt or the like, so as to reduce the gas-flowing space between the outer wall 302 and the inner wall 303.

As shown in FIG. 13 through FIG. 15, the space, in which the panel 2 being the decomposition target is provided. is enclosed by the inner wall 303 made of steel plate and the inner lid 304. Thereby, it is possible to prevent or suppress the gas and the superheated steam inside the inner wall 303 from coming into contact the with thermal insulation sheet layer 311, the heat storage material layer 312, the thermal insulation material layer 313 and the regular brick layer 314; and reduce the deterioration of each brick and flexible thermal insulation material.

Figure 22:
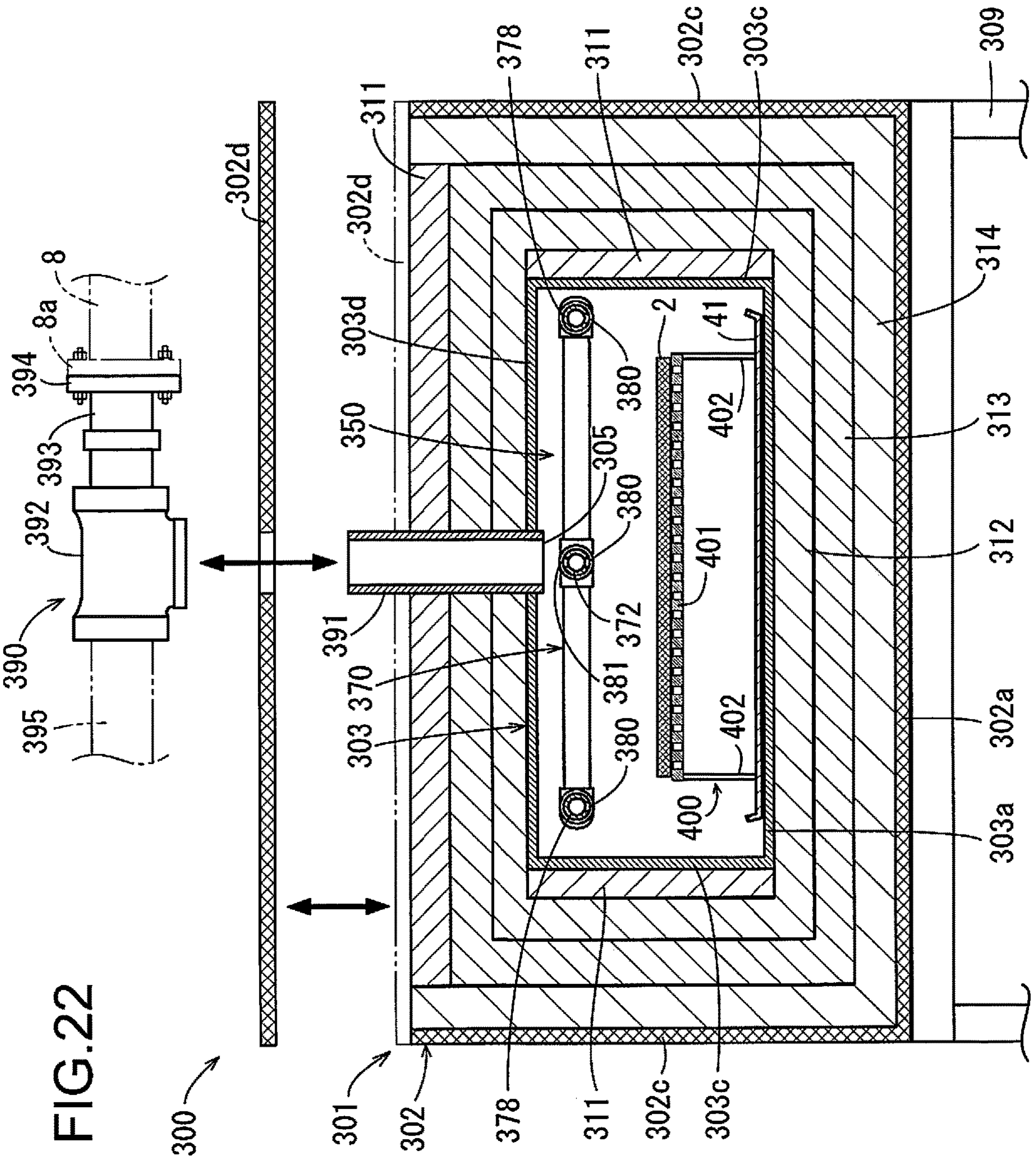
FIG. 22 is a schematic front sectional view showing another example of a thermal decomposition furnace.

As shown in FIG. 22, the top surface 303*d* of the inner wall 303 may be provided to the outer wall 302 so as to be openable and closable. Thereby, since it is possible to perform assembly work and decomposition work of the inner structure of the furnace body 301 with the top surface 303*d* of the inner wall 303 removed, the assemblability and maintainability of the furnace body 301 are improved.

In the furnace body 301, the thermal insulation sheet layer 311 may be of any kind as long as a flexible sheet-shaped thermal insulation material is used. Also, the heat storage material layer 312 is not limited to a layer made of heat storage bricks being lined up and piled up, but may be a layer made of a material having a high heat storage properties. Furthermore, the thermal insulation material layer 313 is not limited to a layer of insulated bricks being lined up and piled up, but may be a layer made of a material having high thermal insulation properties. Moreover, the regular brick layer 314 can be replaced with the thermal insulation material layer 313; and the regular brick layer 314 can also be removed.

<Piping Structure>

Next, the piping structure of the furnace body 301 will be described. As shown in FIG. 13 through FIG. 15, the thermal decomposition furnace 300 is provided with a superheated steam introducing portion 350 for introducing the superheated steam into the inner wall 303 of the furnace body 301; and a gas discharge portion 390 for discharging the gas in the inner wall 303 to the outside of the furnace body 301. (Refer to FIG. 15.)

The gas discharge portion 390 is provided so as to vertically penetrate the top surface 303*d* of the inner wall 303 and the top surface 302*d* of the outer wall 302 from the part closer to the front in the right and left central parts of the top surface 303*d* of the inner wall 303. The gas discharge portion 390 is provided with a gas discharge pipe 391 being installed, penetrating the top surface 303*d* of the inner wall 303 and the top surface 302*d* of the outer wall 302; a tee joint 392 that is screwed into the upper end of the gas discharge pipe 391; a tubular connecting member 393 that is screwed into the tee joint 392; and a discharge pipe flange 394 that is screwed into the connecting member 393. A hot air supply pipe 395 is connected to one of the receiving ports of the tee joint 392.

The discharge pipe flange 394 is connected to the exhaust gas pipe flange 8*a* that is provided to one end of the exhaust gas pipe 8 being connected to the gas cooling device 6. The discharge pipe 391 is a round pipe made of metal. The tee joint 392, the connecting member 393, the discharge pipe flange 394 and the hot air supply pipe 395 are made of metal.

The superheated steam introducing portion 350 is provided with a main pipe portion 360 that is installed, penetrating through both a rear surface 302*b* of the outer wall 302 and a rear surface 303*b* of the inner wall 303 of the furnace body 301; and a branch pipe portion 370 that branches from the main pipe portion 360 inside the inner wall 303.

The main pipe portion 360 is provided with a main pipe 361 being a round pipe made of a metal that extends in the longitudinal direction, penetrating through the portions close to the upper parts of the right and left central portions of the rear surface 302*b* of the outer wall 302 and the rear surface 303*b* of the inner wall 303; a main pipe flange 362 made of metal that is screwed into an outside-the-furnace end of the main pipe 361; and a cross joint 363 made of metal that is screwed into an end of the main pipe 361 inside the furnace.

A main pipe insertion hole 306 for inserting the main pipe 361 is provided in the back surface of the furnace body 301, penetrating the rear surface 302*b* of the outer wall 302, the regular brick layer 314, the thermal insulation sheet layer 311, the thermal insulation material layer 313, and the rear surface 303*b* of the inner wall. The main pipe flange 362 being connected to the outside-the-furnace end of the main pipe 361 is connected to the steam pipe flange 7*a* that is provided to the end of the superheated steam pipe 7 being supplied with the superheated steam being generated by the superheated steam generator 5.

The branch pipe portion 370 being installed inside the inner wall 303 is provided with a central branch pipe portion 371, and the right and the left lateral branch pipe portions 375. The central branch pipe portion 371 is provided with a central branch pipe 372 one of which ends is screwed into the cross joint 363, extending in the longitudinal direction; and a plugging member 373 such as a cap or the like that is screwed into the front end of the central branch pipe 372 (the opposite end to the cross joint 363).

The lateral branch pipe portion 375 is comprised of lateral connecting pipes 376 being formed in an L shape in a plane view that are screwed into a cross joint 363 and extend outward in the right and the left directions; elbow joints 377 that are screwed into the right and left outer ends of the lateral connecting pipes 376; lateral branch pipes 378 that are screwed into the elbow joints 377 and extend in the longitudinal direction; and plugging members 373 that are screwed into the front ends (the opposite ends to the elbow joints 377) of the lateral branch pipes 378. The central branch pipe 372, the lateral connecting pipes 376, and the right and the left lateral branch pipes 378 are round pipes made of metal. The plugging members 373 and the elbow joints 377 are made of metal.

The central branch pipe 372, the lateral connecting pipe 376, and the right and the left lateral branch pipes 378 are installed to the part close to the top of the inner space of the inner wall 303. Each of the central branch pipe 372 and the right and the left lateral branch pipes 378 is provided with a plurality of spray portions 380 for spraying the superheated steam. In the present embodiment, the spray portion 380 is formed of through holes that are made in the central branch pipe 372 and the lateral branch pipe 378, so as to spray the superheated steam downward. The spray portion 380 may be a nozzle.

The central branch pipe 372 is installed below the lower end of the gas discharge pipe 391. The central branch pipe 372 is provided with a spray portion 381 facing a discharge port for the purpose of spraying the superheated steam upward to the gas discharge port 305 being provided on the lower end of the gas discharge pipe 391. In the present embodiment, the facing-a-discharge-port spray portion 381 is formed as a through hole that is made in the central branch pipe 372. A nozzle may be used as the spray portion 381 facing a discharge port.

By injecting the superheated steam into the gas discharge port 305 inside the furnace body 301, gas being discharged from the inside of the furnace body 301 can be heated inside the furnace body 301 (inside the inner wall 303) immediately before being sucked into the gas discharge port 305; and the components that are contained in the gas being discharged from the inside of the furnace body 301 can be thermally decomposed. As long as the structure is such that the superheated steam can be sprayed towards the gas discharge port 305 from the spray portion 381 of the branch pipe portion 370, the structures such as the piping route of the branch pipe portion 370, the position and the orientation of the facing-a-discharge-port spray portion 381, and the position of the gas discharge port 305 or the like are not limited specifically.

As shown in FIG. 15, the gas flowing through the gas discharge portion 390 from the inside of the inner wall 303 to the exhaust gas pipe 8 is combined with high-temperature air of, for example, about 500 degrees to 800 degrees from the hot air supply pipe 395 being connected to the tee joint 392. Thereby, components that are contained in the gas being discharged from the inner wall 303 can be decomposed, so that it is possible to reduce the burning odor of the gas being discharged from the discharge pipe 9.

Furthermore, the furnace body 301 may be constructed in such a manner that the hot air supply pipe 395 is not connected to the gas discharge portion 390. In this case, a plugging member such as a plug or the like is installed to the receiving port of the tee joint 392 in place of the hot air supply pipe 395. It is also possible to use an elbow joint in place of the tee joint 392.

In the superheated steam introducing portion 350, a main pipe flange 362 is screwed into the outside-the-furnace end of the main pipe 361 that penetrates the wall (the back surface in the present embodiment) of the furnace body 301. In the abovementioned structure, after assembling the main pipe portion 360 and branch pipe portion 370 of the superheated steam introducing portion 350 excluding the main pipe flange 362, by inserting the main pipe 361 into the main pipe insertion hole 306, being provided in the wall of the furnace body 301, from the inside of the furnace body 301, so as to make the outside of the furnace body 301 exposed, the assembled branch pipe portion 370 can be provided inside the furnace body 301. Then, by screwing the main pipe flange 362 into the end of the main pipe 361 being exposed to the outside of the furnace body 301, thereby making it possible to connect to the steam pipe flange 7*a*.

In this way, by constructing in such a manner that the main pipe flange 362 can be screwed into the outside-the-furnace end of the main pipe 361 of the superheated steam introducing portion 350, it becomes easy to install the superheated steam introducing portion 350 to the furnace body 301; and to remove the superheated steam introduction portion 350 from the furnace body 301; thereby enhancing the maintainability. Since the worker can perform the installation and removal work of the superheated steam introducing portion 350 to and from the furnace body 301 without entering the inside of the furnace body 301, the burden on the worker is reduced. Moreover, since the diameter of the main pipe insertion hole 306 being made in the wall of the furnace body 301 for inserting the main pipe 361 of the superheated steam introducing portion 350 can remain large enough for the main pipe 361 to be inserted (for example, slightly bigger than the outer diameter of the main pipe 361 and smaller than the outer diameter of the main pipe flange 362), it is possible to suppress the radiation of the heat in the furnace body 301 through the main pipe insertion hole 306.

The main pipe insertion hole 306 may be made in any of the walls (the top surface, the side surfaces, the bottom surface and the back surface) of the furnace body 301. In the present embodiment, the superheated steam introducing portion 350 and the gas discharge portion 390 are constructed in such a manner that a connecting member such as a joint or a flange or the like is screwed into a straight pipe; but the connecting member may be fixed to the straight pipe by welding, or a bending pipe may be used. However, as described above, it is preferable that the main pipe 361 of the superheated steam introducing portion 350 and the main pipe flange 362 are connected to each other by screwing.

<Panel Support Shelf>

As shown in FIG. 14 and FIG. 15, the panel 2 to be decomposed is placed on a panel support shelf 400 being provided on the tray 41, and is housed inside the furnace body 301 (inside the inner wall 303). The panel support shelf 400 is provided with a panel-mounting portion 401 on which the panel 2 is placed, and a plurality of legs 402 that support the panel-mounting portion 401.

The tray 41 is provided with a side wall that stands on the periphery of the bottom portion being in the shape of a rectangular plate. The panel-mounting portion 401 has a large number of openings on the surface on which the panel 2 is placed, and is made of, for example, a net or a perforated plate. The legs 402 are provided so as to hang down from the periphery of the panel-mounting portion 401; and the lower ends of the legs 402 are installed to the tray 41.

By providing a large number of openings to the panel-mounting portion 401, it becomes easy for the high-temperature superheated steam to come into contact with the lower surface of the panel 2, so that the panel 2 can be uniformly heated; and by reducing the temperature variation in each area of the panel 2, the time of the decomposition treatment of the panel 2 can be shortened.

Residues of the panel 2 after the decomposition treatment either remain on the panel-mounting portion 401 or fall from the opening of the panel-mounting portion 401 so as to be received on the tray 41. In the present embodiment, the tray 41 and the panel support shelf 400 are provided to be separable. Thereby, after taking out residues of the panel 2 from the furnace body 301 together with the tray 41 and the panel support shelf 400 after decomposition treatment of the panel 2, the residues of the panel 2 can be easily collected by separating the tray 41 and the panel support shelf 400.

Figure 23:
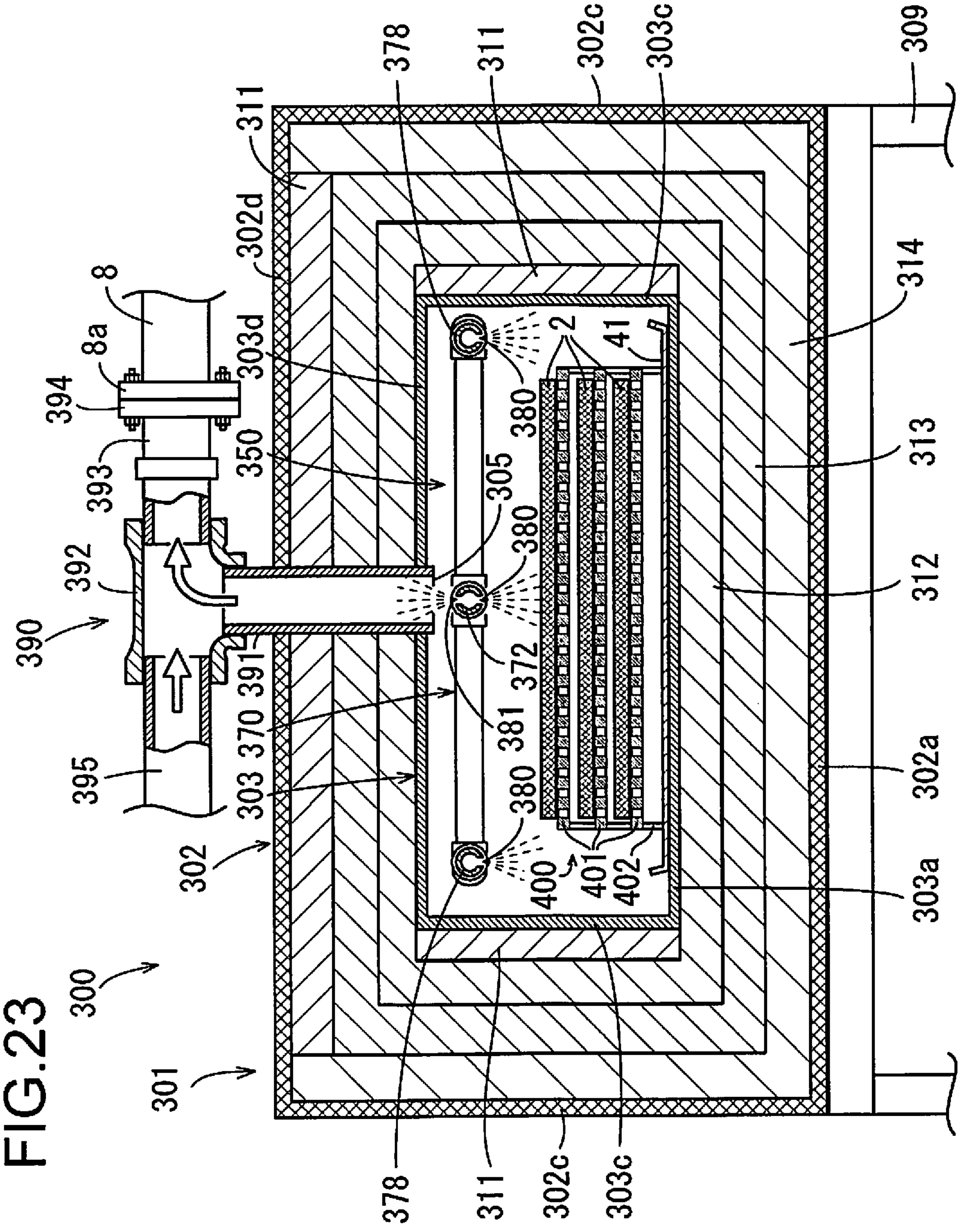
FIG. 23 is a schematic front sectional view showing another example of a panel support shelf.

As shown in FIG. 23, the panel support shelf 400 may be provided with a plurality of panel-mounting portions 401 that are provided with a space between each other in a vertical direction. According to such a structure, by placing a panel 2 on each of the panel-mounting portions 401, it is possible to increase the number of panels that can be treated in one thermal decomposition treatment process; thereby enhancing the treatment efficiency.

<Another Example of the Furnace Body>

Figure 24B:
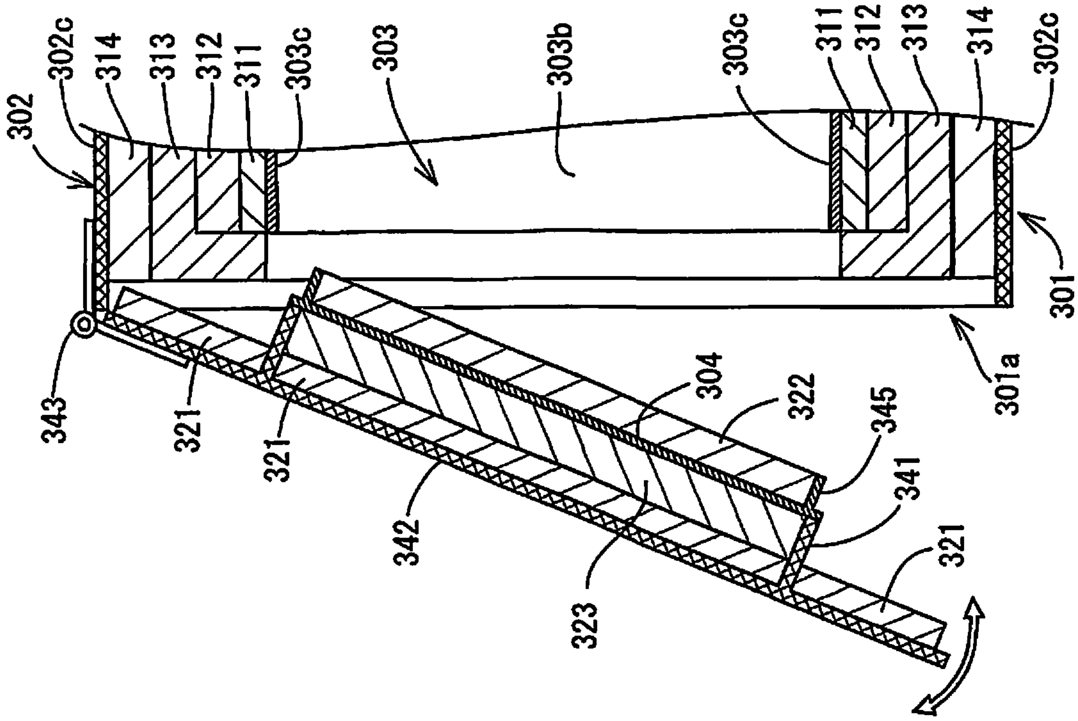
FIGS. 24A and 24B are schematic cross-sectional views showing other examples of a thermal decomposition furnace.
Figure 24A:
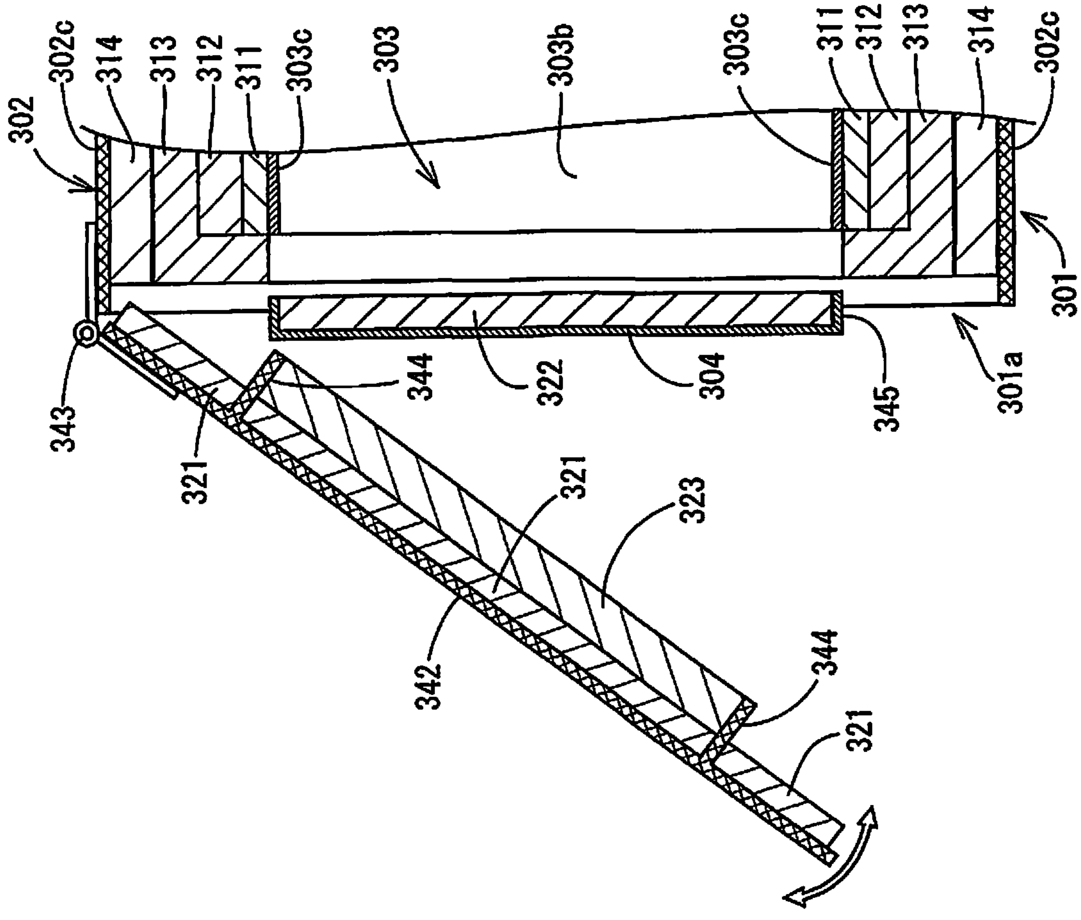

FIGS. 24A and 24B are cross-sectional views for explaining another example of the furnace body. As shown in FIG. 24A, a door 342 is provided with a frame-shaped insulated brick holding portion 344 that holds a thermal insulation material layer 323 on an inward surface 342*a* facing the inner wall 303, in the closed state. A thermal insulation sheet layer 321 is attached to the inside and the perimeter of the insulated brick holding portion 344 on the inward surface 342*a* of the door 342. A plurality of insulated bricks is fixed to the inside of the insulated brick holding portion 344, so as to form the thermal insulation material layer 323 for a lid.

Furthermore, the inner lid 304 is provided with a frame-shaped heat storage brick holding portion 345 that holds a heat storage material layer 322. A plurality of heat storage bricks is fixed to the inside of the heat storage brick holding portion 345 so as to form the heat storage material layer 322 for a lid.

In this example of different structure, since the thermal insulation material layer 323 is supported by the door 342, it is possible to remove and install the thermal insulation material layer 323 by opening and closing the door 342; thereby improving the convenience. In addition, since the heat storage material layer 322 is supported by the inner lid 304, it is possible to remove and install the inner lid 304 and the heat storage material layer 322 integrally; thereby improving the convenience.

As shown in FIG. 24B, an inner lid 304 having a heat storage brick holding portion 345 may be fixed to the insulated brick holding portion 344 being provided to the door 342. Thereby, opening and closing the door 342 makes it possible to remove and install the thermal insulation material layer 323, the inner lid 304 and the heat storage brick holding portion 345 simultaneously; thereby improving the convenience further.

In the aforementioned embodiment and the example of different structure, a thermal insulation sheet layer 321, a heat storage material layer 322, an inner lid 304 and a thermal insulation material layer 323 are arranged in order starting from the door 342; and the order of the locations of the inner lid 304 and the thermal insulation material layer 323 may be changed between the front and the rear, so that the thermal insulation material layer 323 may be arranged outside the inner lid 304.

<Another Example of Piping Structure>

Figure 25:
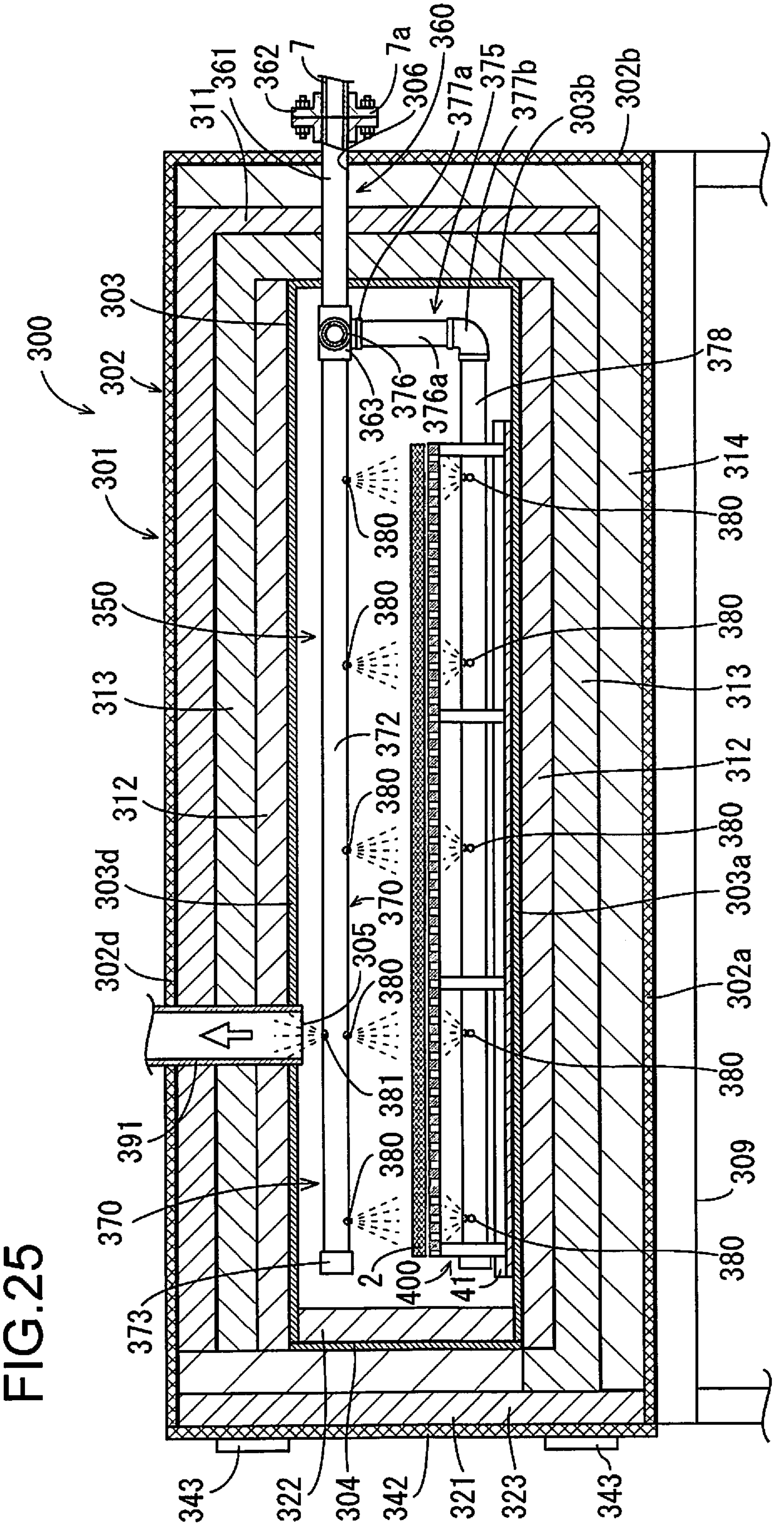
FIG. 25 is a schematic cross-sectional side view showing another example of a thermal decomposition furnace.
Figure 26:
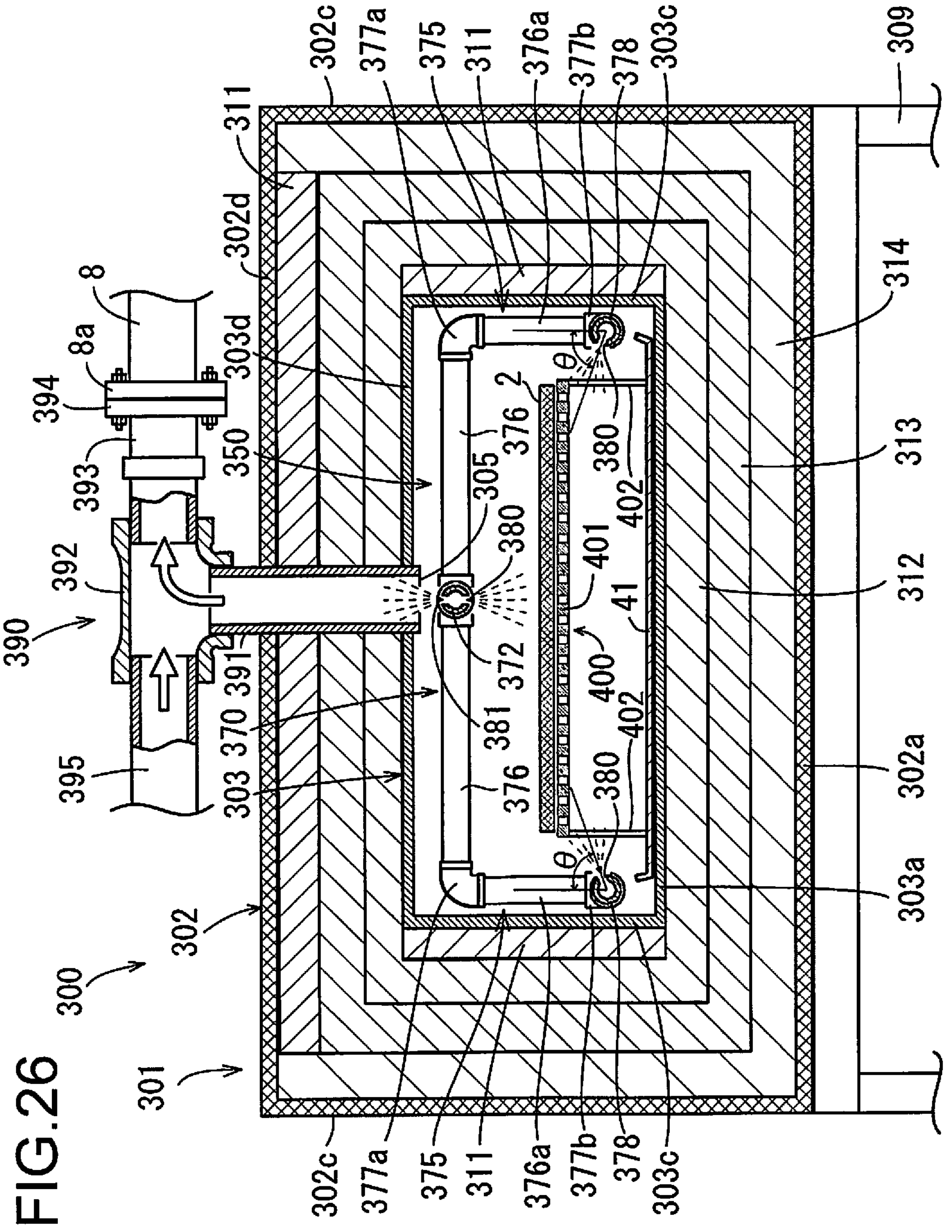
FIG. 26 is a cross-sectional schematic side view showing the thermal decomposition furnace.

Next, another example of the piping structure will be described with reference to FIG. 25 and FIG. 26. FIG. 25 is a schematic cross-sectional side view showing a part of an example of different structure of a thermal decomposition furnace. FIG. 26 is a schematic cross-sectional front view showing a part of the thermal decomposition furnace.

In the example of the abovementioned piping structure, the right and the left lateral branch pipe portions 375 of the branch pipe portion 370 are provided, extending in the longitudinal direction, at a lower position than the panel-mounting portion 401 of the panel support shelf 400. One end (rear end) of the lateral branch pipe portion 375 is connected to the cross joint 363 by way of the lateral connecting pipe 376, the first elbow joint 377*a*, the upper and the lower connecting pipes 376*a* and the second elbow joint 377*b*. These pipes and connecting fittings are connected by, for example, screwing.

The spray portion 380 of the lateral branch pipe portion 375 is constructed to spray the superheated steam inward on the right and left sides. Thereby, it is possible to supply the superheated steam toward the lower part of the panel 2, make the superheated steam come into contact with the panel 2 evenly, and prevent the gas retention under the panel 2 as well.

The spray portion 380 of the lateral branch pipe 378 (lateral branch pipe portion 375) is constructed so as to spray the superheated steam diagonally upward toward the lower surface of the panel 2. Thereby, it is possible to make the superheated steam come into contact with the lower surface of the panel 2 reliably.

The angle θ made by the direction of the spray portion 380 of the lateral branch pipe 378 (the direction of spraying the superheated steam) and the vertical direction is 0 to 180 degrees; or preferably, 0 to 90 degrees; or more preferably, 45 to 90 degrees. However, the direction of the spray portion 380 of the lateral branch pipe 378 is not limited to the above; but may be outward direction on the right and the left sides. Furthermore, the direction of the spray portion of the central branch pipe 372 is not limited to the downward direction, but may be any direction.

Furthermore, in the abovementioned embodiment (including the example of different structure), the piping structure of the superheated steam introducing portion 350 may be as such that can introduce the superheated steam into the inside of the furnace body 301 (the inside of the inner wall 303). For example, in the branch pipe portion 370, a plurality of central branch pipe portions 371 may be provided; or a plurality of lateral branch pipe portions 375 may be provided on the right and left sides, respectively.

<Cooling System>

Figure 27:
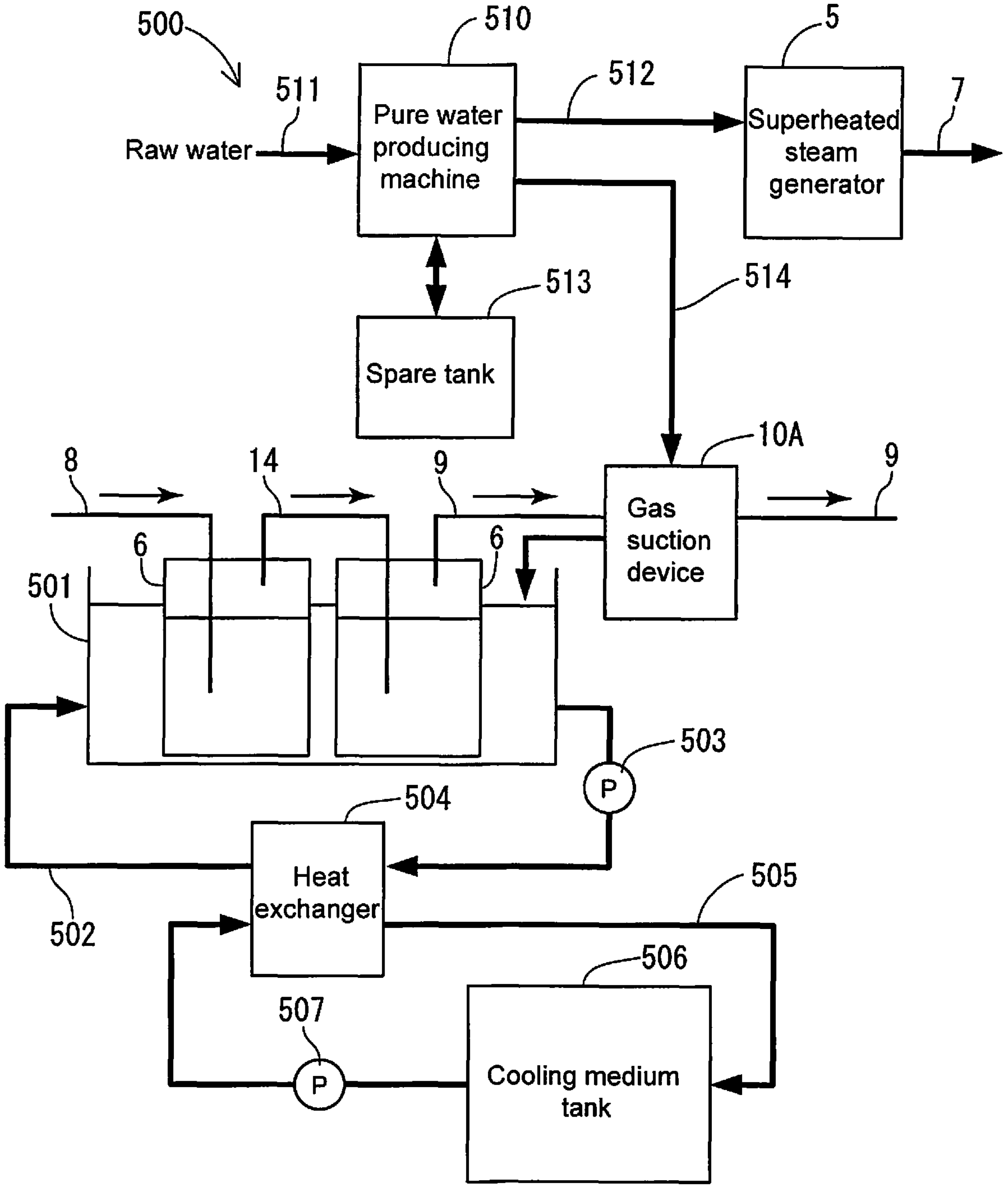
FIG. 27 is a schematic block diagram showing a cooling system of a gas cooling device.

Next, cooling of the gas cooling device will be described. FIG. 27 is a schematic block diagram showing a cooling system of a gas cooling device. The cooling system 500 that cools the gas cooling device 6 immerses the gas cooling device 6 in cooling water that is stored in a cooling tank 501, and cools the gas cooling device 6 with cooling water, circulating the cooling water in the cooling tank 501 by way of the cooling water circulation path 502. In this cooling system 500, the number of the gas cooling devices 6 being placed inside the cooling tank 501 is two; however, the number thereof may be one or three or more.

A cooling water pump 503 and a heat exchanger 504 are installed in the cooling water circulation path 502. The cooling water flowing through the cooling water circulation path 502 is cooled by exchanging heat with the cooling medium that flows through the cooling medium circulation path 505 being connected to the heat exchanger 504. The cooling medium is, for example, water; but is not specifically limited. In the cooling medium circulation path 505, a cooling medium tank 506 that stores and cools the cooling medium, and a cooling medium pump 507 that circulates the cooling medium are joined.

The cooling system 500 can cool the closed tank 61 and the water 60 therein by making the cooling water come into contact with the outer periphery of the closed tank 61 of the gas cooling device 6; and thereby, it is possible to prevent deterioration of gas cooling function of the gas cooling device 6 due to a high temperature of the water 60.

As shown in FIG. 27, the cooling tank 501 is supplied with overflow pure water that overflows from a pure water producing machine 510 that supplies pure water to the superheated steam generator 5. The pure water producing machine 510 is connected to a raw water channel 511 that is supplied with raw water such as tap water, underground water, industrial water or the like; a pure water supply channel 512 that supplies pure water to the superheated steam generator 5; a spare tank 513 that stores pure water; and a pure water discharge channel 514 that discharges the overflow pure water.

The pure water being discharged from the pure water discharge channel 514 is supplied to the cooling tank 501 after cooling the gas suction device 10A being installed in the discharge pipe 9. By cooling the gas suction device 10A that discharges the gas in the gas cooling device 6, it is possible to prevent deterioration of the suction function (blowing function) of the gas suction device 10A, by utilizing the overflow pure water without waste, even when the gas flowing through the discharge pipe 9 is at a high temperature.

By supplying the overflow pure water from the pure water producing machine 510 to the cooling tank 501 so as to be used as the cooling water, it is possible to eliminate or reduce the work of replenishing cooling water due to evaporation.

When it is not necessary to cool the gas suction device 10A or the exhaust fan 10 (See FIG. 1.), the overflow pure water from the pure water producing machine 510 may be directly supplied to the pure water producing machine 510. Furthermore, when the cooling medium flowing through the cooling medium circulation path 505 is water, the overflow pure water may be supplied to the cooling medium tank 506. In this case, it is possible to eliminate or reduce the work of replenishing water as a cooling medium to the cooling medium tank 506.

<Another Example of the Cooling System>

Figure 28:
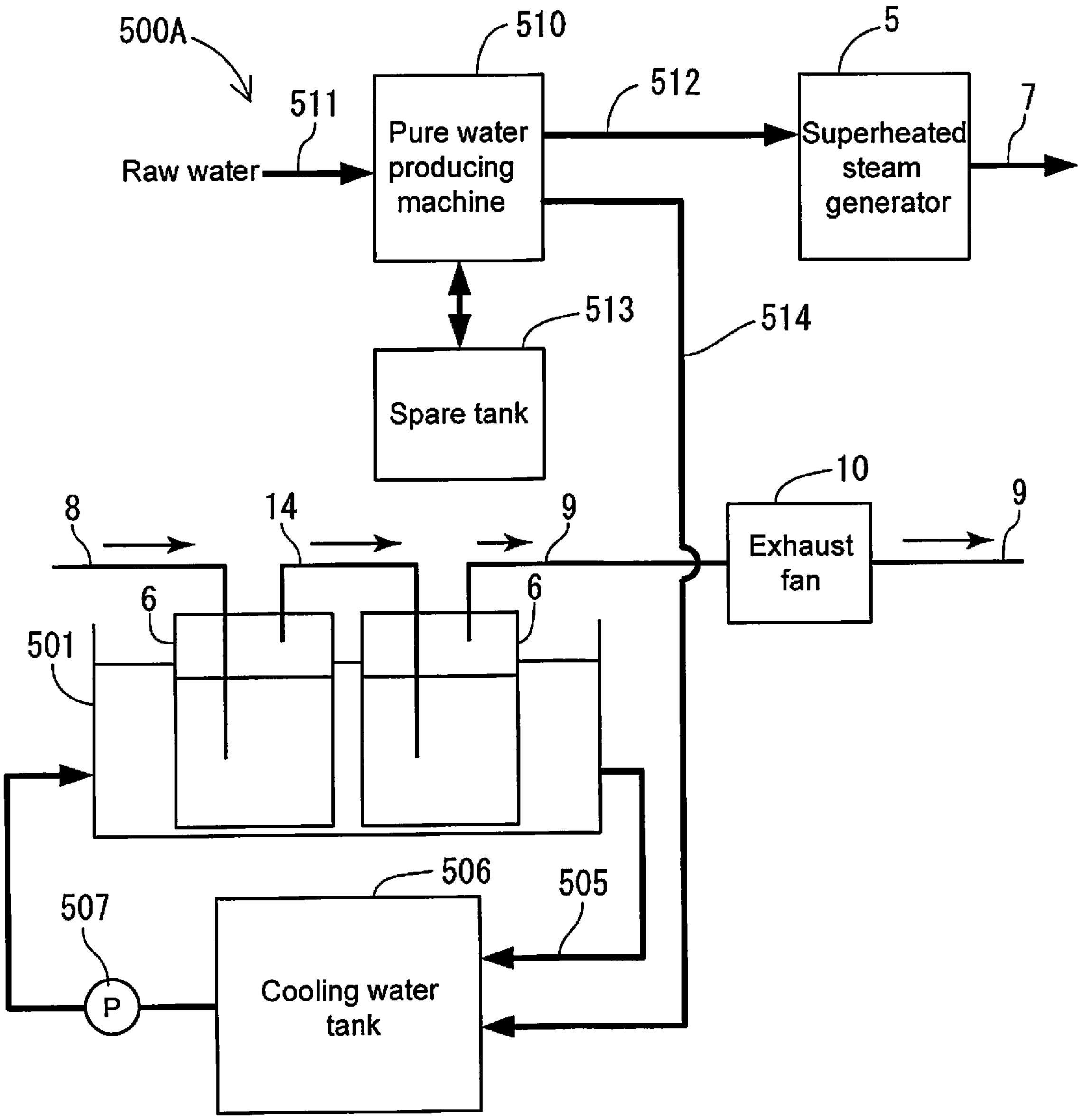
FIG. 28 is a schematic block diagram showing another example of a cooling system of a gas cooling device.

FIG. 28 is a schematic block diagram showing another example of a cooling system of a gas cooling device. In this cooling system 500A, a cooling water tank 508 that stores cooling water is provided in the cooling water circulation path 502. Since the cooling system 500A is not provided with a heat exchanger 504, a cooling medium circulation path 505, a cooling medium tank 506 and a cooling medium pump 507 that are shown in FIG. 28, it is possible to cool the gas cooling device 6 having a simple structure.

In the cooling system 500A, overflow pure water being discharged from the pure water producing machine 510 by way of the pure water discharge channel 514 is supplied to the cooling water tank 508. As a result, it is possible to eliminate or reduce the work of replenishing cooling water due to evaporation, by utilizing the overflow pure water without waste. The overflow pure water may be supplied to the cooling water tank 508 or the cooling tank 501 by way of the exhaust fan 10 (or the gas suction device 10A); or may be directly supplied to the cooling tank 501 from the pure water discharge channel 514.

<Another Example of the Thermal Decomposition Furnace>

Figure 29:
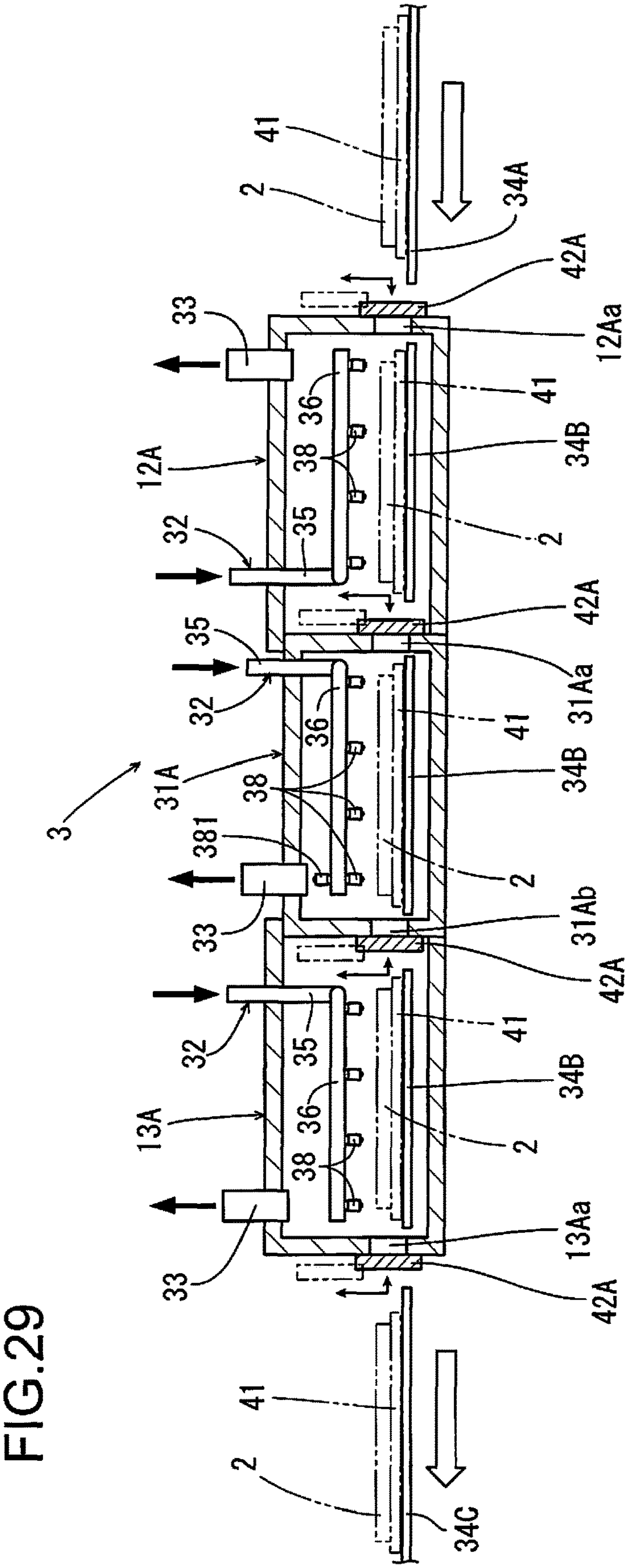
FIG. 29 is a schematic cross-sectional side view showing another example of a thermal decomposition furnace.

Next, another example of a thermal decomposition furnace will be described with reference to FIG. 29. FIG. 29 is a schematic side view showing another example of the thermal decomposition furnace. In FIG. 29, a furnace body 31A, a pre-treatment chamber 12A and a post-treatment chamber 13A are shown in a vertical section.

The thermal decomposition furnace 3 is provided with a furnace body 31A; and a pre-treatment chamber 12A and a post-treatment chamber 13A that are connected to the front and the rear of the furnace body 31A. Each of the furnace body 31A, the pre-treatment chamber 12A and the post-treatment chamber 13A is provided with a superheated steam introduction pipe 32, a gas discharge pipe 33 and an in-furnace conveyance portion 34B, respectively.

The superheated steam introducing pipe 32 is provided with a main steam pipe portion 35, an upper steam pipe portion 36 and upper nozzles 38. The upper steam pipe portion 36 in the furnace body 31A is provided with a facing-a-discharge-port spray portion 381 being composed of, for example, a nozzle. The piping structure of the superheated steam introduction pipe 32 and the gas discharge pipe 33 may be of any structure as long as the superheated steam can be introduced into and discharged from the furnace body 31A, the pre-treatment chamber 12A or the post-treatment chamber 13A; wherein, for example, the main steam pipe portion 35 may penetrate the sides of the housing; or may have the same structure as the superheated steam introducing portion 350 shown in FIG. 13 through FIG. 16. In addition, the furnace body 31A, the pre-treatment chamber 12A and the post-treatment room 13A may have different piping structure of the superheated introducing pipe 32 and the gas discharge pipe 33 from each other.

The furnace body 31A is provided with a front opening 31Aa being formed on a front side wall which the pre-treatment chamber 12A is connected to; and a rear opening 31Ab being formed on a rear side wall which the post-treatment chamber 13A is connected to. The pre-treatment chamber 12A includes a receiving entrance 12Aa on the front side facing the furnace body 31A. The post-treatment chamber 13A includes a conveyance ejection port 13Aa on the rear side surface facing the furnace body 31A.

An entrance-side conveyance portion 34A is provided in front of the pre-treatment chamber 12A. An ejection-side conveyance portion 34C is provided behind the pre-treatment chamber 12A. The entrance-side conveyance portion 34A, the in-furnace conveyance portion 34B being divided into three, and the ejection-side conveyance portion 34C intermittently conveys the panel 2 being placed on the tray 41, by way of the openings 12Aa, 31Aa, 31Ab and 13Aa, so as to stop the panel 2 in the pre-treatment chamber 12A, the furnace body 31A and the post-treatment chamber 13A.

Each of the openings 12Aa, 31Aa, 31Ab and 13Aa is constructed to be opened and closed by a door 42A. The door 42A that opens and closes the receiving entrance 12Aa is provided outside the pre-treatment chamber 12A. The door 42A that opens and closes the front opening 31Aa is provided inside the pre-treatment chamber 12A. The door 42A that opens and closes the rear opening 31Ab is provided inside the post-treatment chamber 13A. The door 42A that opens and closes the conveyance ejection port 13Aa is provided outside the post-treatment chamber 13A.

The door 42A is displaced by an opening and closing mechanism of a door (not illustrated herein), so as to open and close the openings 12Aa, 31Aa, 31Ab or 13Aa. When the door 42A is closed, the door is pressed by the periphery of the opening 12Aa, 31Aa, 31Ab or 13Aa; thereby enhancing the adhesion. In opening the door 42A, after reducing the pressing force toward the opening 12Aa, 31Aa, 31Ab or 13Aa, the door 42 is made to slide, for example, upward so that the opening 12Aa, 31Aa, 31Ab, or 13Aa will be opened.

The inside of the furnace body 31 and the insides of the pre-treatment chamber 12A and the post-treatment chamber 13A are filled with the superheated steam being supplied from the superheated steam introducing pipe 32, and come to be in a state containing little oxygen. The temperature in the furnace body 31 is raised to such a temperature at which the plastic resin being contained in the panel 2 is vaporized; for example, 400 to 1200 degrees, and preferably, 600 degrees or higher. The temperature in the pre-treatment chamber 12A is such a temperature at which water vapor does not become liquid water, and at which the plastic resin being contained in the panel 2 is not vaporized. For example, the lower limit temperature is 100 degrees or higher; and the upper limit temperature is 250 degrees or lower, and preferably 200 degrees or lower. The temperature in the post-treatment chamber 13A is such a temperature at which water vapor does not become liquid water; namely, 100 degrees or higher.

The tray 41 with a panel 2 being a decomposition target mounted thereon is placed in the entrance-side conveyance portion 34A that is on the upstream side of the pre-treatment chamber 12A in the conveying direction. In the decomposition treatment process, first, the receiving entrance 12Aa is opened; and then by driving the entrance-side conveyance portion 34A and the in-furnace conveyance portion 34B, the panel 2 and the tray 41 are transferred into the pre-treatment chamber 12A. By opening the receiving entrance 12Aa temporarily, the ambient air enters the pre-treatment chamber 12A, so that the amount of water vapor and the temperature inside the pre-treatment chamber 12A decrease. On the other hand, since the front opening 31Aa of the furnace body 31A is closed by the door 42A, the amount of water vapor and the temperature inside the furnace body 31A do not change.

Subsequently, the receiving entrance 12Aa is closed. The inside of the pre-treatment chamber 12A is filled with the superheated steam being supplied from the superheated steam introducing pipe 32; and the air is discharged; and at the same time, the temperature is raised to such a temperature at which the plastic resin being contained in the panel 2 is not vaporized.

Next, the front opening 31Aa of the furnace body 31A is opened; and by driving the in-furnace conveyance portions 34B in the furnace body 31A and the pre-treatment chamber 12A, the panel 2 and the tray 41 are transferred into the furnace body 31A. At this time, the rear opening 31Ab of the furnace body 31A and the receiving entrance 12Aa of the pre-treatment chamber 12A are closed by the door 42A. By opening the front opening 31Aa temporarily, the furnace body 31A and the pre-treatment chamber 12A communicate with each other; but since both insides of the furnace body 31A and the pre-treatment chamber 12A are filled with the superheated steam and have little oxygen, it is possible to prevent the inflow of oxygen into these spaces. In addition, the superheated steam in the pre-treatment chamber 12A enters the furnace body 31A so as to lower the temperature in the furnace body 31A; however, since the temperature of the inside of the pre-treatment chamber 12A is raised to the predetermined temperature (for example, as high as 200 degrees), it is possible to reduce the temperature decrease in the furnace body 31A.

Thereafter, the front opening 31Aa is closed. The inside of the furnace body 31A is heated by the superheated steam being supplied from the superheated steam introducing pipe 32, so as to raise the temperature thereof to be such a temperature at which the plastic resin being contained in the panel 2 is vaporized (for example, 600° C. or higher). The panel 2 having a plastic material layer is heated to, for example, 600° C., or higher in a superheated steam atmosphere; and the plastic resin is sublimated or decomposed so as to be vaporized and discharged from the gas discharge pipe 33. When the panel 2 is a solar cell panel, the plastic material layer such as a filler, an adhesive, a back film or the like of the panel 2 is vaporized and removed; and the panel 2 is separated into a cover glass, solar cells and metal wiring members.

After the plastic material layer of the panel 2 is removed in the furnace body 31A, the rear opening 31Ab of the furnace body 31A is opened; and by driving the in-furnace conveyance portions 34B in the furnace body 31A and the post-treatment chamber 13A, the decomposed panel 2 (panel residues) and the tray 41 are transferred into the post-treatment chamber 13A. At this time, the front opening 31Aa of the furnace body 31A and the conveyance ejection port 13Aa of the post-treatment chamber 13A are closed. By opening the rear opening 31Ab temporarily, the furnace body 31A and the post-treatment chamber 13A communicate with each other. However, since both insides of the furnace body 31A and the post-treatment chamber 13A are filled with the superheated steam and contain little oxygen, it is possible to prevent the inflow of oxygen into these spaces.

Furthermore, the superheated steam in the post-treatment chamber 13A enters the furnace body 31A, so that the temperature in the furnace body 31A is decreased. However, since the temperature of the inside of the post-treatment chamber 13A is raised to the predetermined temperature (for example, 200 degrees or higher), it is possible to reduce the temperature decrease in the furnace body 31A. At this point, by raising the temperature of the inside of the post-treatment chamber 13A to a higher temperature (for example, 300 degrees or higher) before the rear opening 31Ab is opened, it is possible to further reduce the temperature decrease in the furnace body 31A when the rear opening 31Ab is opened.

After the rear opening 31Ab is closed, the conveyance ejection port 13Aa of the post-treatment chamber 13A is opened; and by driving the in-furnace conveyance portion 34B and the ejection-side conveyance portion 34C in the post-treatment chamber 13A, the panel 2 (panel residues) and the tray 41 are taken out from the post-treatment chamber 13A. At this time, since the rear opening 31Ab of the furnace body 31A is closed, it is possible to prevent the temperature decrease and the air inflow in the furnace body 31A. Before opening the conveyance ejection port 13Aa, cooling time may be provided for decreasing the temperature of the panel 2 and the tray 41 in the post-treatment chamber 13A.

As described above, according to the thermal decomposition furnace 3 of the present embodiment, the panel 2 can be sequentially and continuously decomposed. In addition, the thermal decomposition furnace 3 of the present embodiment can prevent the inflow of oxygen into the furnace body 31A that becomes high temperature, so that the panel 2 can be safely decomposed.

During the decomposition treatment of the panel 2 in the furnace body 31A, by bringing the panel 2, for which the next decomposition process is conducted, into the pre-treatment chamber 12A and by filling the inside of the pre-treatment chamber 12A with the superheated steam, it is possible to shorten the waiting time for transferring the panel 2 to the next process. Furthermore, after decomposition treatment of the panel 2 inside the furnace body 31A is completed, with the insides of the pre-treatment chamber 12A and the post-treatment chamber 13A filled with the superheated steam, it is possible to shorten the treatment time further, by opening the front opening portion 31Aa and the rear opening portion 31Ab; and by transferring a pre-decomposition panel 2 in the pre-treatment chamber 12A into the furnace body 31A while transferring the post-decomposition panel 2 inside the furnace body 31A into the post-treatment chamber 13A.

In addition, after filling the chambers 12A and 13A with the superheated steam and closing the door, it is possible to reduce the treatment cost, by stopping the supply of the superheated steam to the chambers 12 and 13 so as to decrease the supply amount of the superheated steam while restraining the inflow of oxygen into the furnace body 31. The gas being supplied to the chambers 12A and 13A may be nitrogen gas.

The furnace body 31A and the chambers 12A and 13A can have the same structure as the furnace body 301 that is described with reference to FIG. 13 through FIG. 22. Namely, the furnace body 31A and the chambers 12A and 13A may be provided with an inner wall made of metal having a space for housing the panel; and an outer wall made of metal that encloses the inner wall; and also may be provided with a thermal insulation material layer, which encloses the inner wall, between the inner wall and the outer wall; and a heat storage material layer being installed between the inner wall and the thermal insulation material layer. In addition, in the furnace body 31A and the chambers 12A and 13A, a thermal insulation sheet layer that is made of a flexible sheet-like thermal insulation material may be provided between the inner wall and the outer wall, so as to enclose the inner wall.

The superheated steam introducing portion that introduces the superheated steam into the furnace body 31A and the chambers 12A and 13A can have the same structure as the superheated steam introducing portion 350, being described with reference to FIG. 13 through FIG. 22. Namely, the superheated steam introducing portion that introduces the superheated steam into the furnace body 31A and the chambers 12A and 13A may be provided with a main pipe portion penetrating the outer wall and the inner wall of the furnace body; and a branch pipe portion branching from the main pipe portion inside the inner wall; wherein, the main pipe portion may be provided with a main pipe penetrating the outer wall and the inner wall; and a main pipe flange being screwed into an end of the main pipe outside the furnace.

A thermal decomposition apparatus of the abovementioned embodiment comprises a thermal decomposition apparatus mechanism having a thermal decomposition furnace that decomposes a panel having a plastic layer; and a superheated steam generator that generates superheated steam to be supplied to the thermal decomposition furnace; wherein, the thermal decomposition apparatus mechanism is provided with a plurality of gas cooling devices that cools and solidifies exhaust gas from the thermal decomposition furnace containing components of the plastic material layer being vaporized in the thermal composition furnace; wherein, the thermal decomposition furnace is provided with a plurality of nozzles that spray the superheated steam; the gas cooling device is provided with a closed tank containing water, an exhaust gas introducing pipe that introduces the exhaust gas into the closed tank, and a gas discharge pipe that introduces the exhaust gas to the outside of the closed tank; wherein an end of the exhaust gas introducing pipe is immersed in water inside the enclosed tank; while an end of the gas discharge introducing pipe is designed not to be made to be immersed in water; and a mesh member or a porous member is installed to the end of the exhaust gas introducing pipe.

According to the thermal decomposition apparatus of the present invention, since a panel is heated by using the superheated steam, it is possible to heat the panel having a plastic material layer in a superheated steam atmosphere containing little oxygen, and to prevent a fire or the like in the thermal decomposition furnace; thereby conducing decomposition treatment safely. In addition, in the thermal decomposition apparatus of the present invention, by heating the panel, having a plastic material layer, with high temperature superheated steam in the thermal decomposition fire, the plastic material layer is sublimated and vaporized; thereby making it possible to remove the plastic material layer from the panel. Furthermore, by making the gas containing plastic material components sublimated in the thermal decomposition furnace, pass through the water in the gas cooling device so as to be solidified, and by making solid plastic materials precipitate in the gas cooling device, it is possible to prevent most of the gases having a high environmental load, such as carbon dioxide and hydrocarbon-based gas, from being released to the outside of the gas cooling device. In addition, since the target of treatment to be conducted by the thermal decomposition apparatus of the present embodiment is a panel (an article in a shape of a plate), it is possible to reduce the size of an internal space of the thermal decomposition furnace in panel thickness; thereby reducing the energy that is necessary for making the internal space be at a high temperature. Moreover, by placing a plurality of nozzles spraying superheated steam so as to face the main surface of the panel, it is possible to reduce a temperature variation of the panel, thereby shortening the time of the decomposition treatment of the panel.

In the thermal decomposition apparatus of the abovementioned embodiment, when the panel is, for example, a solar cell panel, by heating the solar cell panel with high temperature superheated steam, a plastic material layer such as a filler, an adhesive and a back film that cover the solar cell, is sublimated and vaporized, so that the plastic material layer can be decomposed into metals such as a cover glass, solar cells, and metal members such as copper wires or the like. Thereby, a used solar cell panel can be decomposed into solar cells containing a recyclable raw material such as silicon or the like; recyclable metal members; and glass, without discharging a gas having a high environmental load.

In the thermal decomposition apparatus of the abovementioned embodiment, the thermal decomposition furnace may be provided with a plurality of nozzles that sprays the superheated steam, and the plurality of nozzles may be arranged so as to sandwich the panel.

According to such a structure, the panel can be efficiently heated from both sides, so that the decomposition of the panel can be promoted, thereby shortening the treatment time.

Furthermore, in the thermal decomposition apparatus of the abovementioned embodiment, the thermal decomposition furnace is provided with a plurality of nozzles that sprays the superheated steam; wherein the plurality of nozzles may be arranged longitudinally and horizontally along a horizontal surface that is in parallel with the panel in the thermal decomposition furnace and be arranged facing the panel.

In the thermal decomposition apparatus of the abovementioned embodiment, the thermal decomposition furnace is provided with a superheated steam introducing pipe that introduces superheated steam into the thermal decomposition furnace; and also comprises a main pipe portion in which the superheated steam introducing pipe introduces superheated steam from the outside, penetrating the thermal decomposition furnace; and a branch pipe portion which is connected to the main pipe portion in the thermal decomposition furnace and is provided with the nozzles; and wherein, the branch pipe portion may be constructed in a multiple-time repeated zigzag pattern on a horizontal plane being in parallel with the panel.

In the thermal decomposition apparatus of the abovementioned embodiment, the thermal decomposition apparatus mechanism may be provided with a filter on an exhaust pipe of the gas cooling device.

According to this structure, by removing harmful gas in the exhaust gas from a thermal decomposition furnace through the filter of the exhaust pipe after solidifying the gas with the gas cooling device, it is possible to reliably prevent the release of the harmful gas to the outside.

The decomposition target of the thermal decomposition apparatus of the present invention is a panel having a plastic layer; however, by using the thermal decomposition apparatus of the present invention, it is possible to decompose a plastic material such as a PET bottle or the like, or a waste material containing the plastic material or the like.

The embodiment is described hereinabove. The present invention can be applied not only to the abovementioned embodiment but also to various structures that are embodied. The structure of each portion is not limited to the illustrated embodiments, but can be changed variously as long as the intent of the invention is not deviated.

What is claimed is:

1. A thermal decomposition apparatus comprising:

a thermal decomposition apparatus mechanism being provided with a thermal decomposition furnace that decomposes a panel having a plastic layer; and a superheated steam generator that generates superheated steam being supplied to the thermal decomposition furnace, the thermal decomposition furnace including a furnace body that is provided with an inner wall made of metal having a space for housing the panel, an outer wall made of metal enclosing the inner wall, a thermal insulation material layer provided between the inner wall and the outer wall that encloses the inner wall, and a heat storage material layer provided between the inner wall and the thermal insulation material layer.

2. The thermal decomposition apparatus according to claim 1, wherein the furnace body is further provided with a thermal insulation sheet layer that comprises a sheet-shaped thermal insulation material having flexibility and that is provided between the inner wall and the outer wall, so as to enclose the inner wall.

3. The thermal decomposition apparatus according to claim 1, wherein the thermal decomposition furnace is provided with a superheated steam introducing portion that introduces the superheated steam into the inner wall, the superheated steam introducing portion is provided with a main pipe portion that is installed so as to penetrate the outer wall and the inner wall of the furnace body, and with a branch pipe portion that branches from the main pipe portion, and the main pipe portion is provided with a main pipe that is installed so as to penetrate the outer wall and the inner wall, and with a main pipe flange that is screwed into an end of the main pipe outside the thermal decomposition furnace.

4. The thermal decomposition apparatus according to claim 1, wherein the thermal decomposition furnace comprises a superheated steam introducing portion that introduces the superheated steam into the inner wall, and a gas discharge section that discharges a gas in the inner wall to the outside of the furnace body, and the superheated steam introducing portion is provided with a spray portion that sprays the superheated steam toward a gas discharge port of the gas discharge portion inside the inner wall.

5. The thermal decomposition apparatus according to claim 2, wherein the thermal decomposition furnace is provided with a superheated steam introducing portion that introduces the superheated steam into the inner wall, the superheated steam introducing portion is provided with a main pipe portion that is installed so as to penetrate the outer wall and the inner wall of the furnace body, and with a branch pipe portion that branches from the main pipe portion, and the main pipe portion is provided with a main pipe that is installed so as to penetrate the outer wall and the inner wall, and with a main pipe flange that is screwed into an end of the main pipe outside the thermal decomposition furnace.

6. The thermal decomposition apparatus according to claim 2, wherein the thermal decomposition furnace comprises a superheated steam introducing portion that introduces the superheated steam into the inner wall, and a gas discharge section that discharges a gas in the inner wall to the outside of the furnace body, and the superheated steam introducing portion is provided with a spray portion that sprays the superheated steam toward a gas discharge port of the gas discharge portion inside the inner wall.

* * * * *